(12) United States Patent
Bibl et al.

(10) Patent No.: US 9,318,475 B2
(45) Date of Patent: Apr. 19, 2016

(54) FLEXIBLE DISPLAY AND METHOD OF FORMATION WITH SACRIFICIAL RELEASE LAYER

(71) Applicant: LuxVue Technology Corporation, Santa Clara, CA (US)

(72) Inventors: Andreas Bibl, Los Altos, CA (US); Dariusz Golda, Redwood City, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 0 days.

(21) Appl. No.: 14/278,778

(22) Filed: May 15, 2014

(65) Prior Publication Data
US 2015/0333221 A1 Nov. 19, 2015

(51) Int. Cl.
| | |
|---|---|
| H01L 25/16 | (2006.01) |
| H01L 27/15 | (2006.01) |
| G09F 9/30 | (2006.01) |
| H01L 25/075 | (2006.01) |
| H01L 27/12 | (2006.01) |
| H05K 1/18 | (2006.01) |

(52) U.S. Cl.
CPC .............. *H01L 25/167* (2013.01); *G09F 9/301* (2013.01); *H01L 27/15* (2013.01); *H01L 25/0753* (2013.01); *H01L 27/1266* (2013.01); *H01L 27/153* (2013.01); *H01L 27/156* (2013.01); *H05K 1/189* (2013.01)

(58) Field of Classification Search
CPC ..... H01L 27/32; H01L 25/167; H01L 27/153; H01L 27/156
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |

(Continued)

FOREIGN PATENT DOCUMENTS

| | | |
|---|---|---|
| CN | 103 681 733 A | 3/2014 |
| JP | 07-060675 A | 3/1995 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Yu-Hsi D Sun
(74) *Attorney, Agent, or Firm* — Blakely, Sokoloff, Taylor & Zafman LLP

(57) ABSTRACT

A flexible display panel and method of formation with a sacrificial release layer are described. The method of manufacturing a flexible display system includes forming a sacrificial layer on a carrier substrate. A flexible display substrate is formed on the sacrificial layer, with a plurality of release openings that extend through the flexible display substrate to the sacrificial layer. An array of LEDs and a plurality of microchips are transferred onto the flexible display substrate to form a flexible display panel. The sacrificial layer is selectively removed such that the flexible display panel attaches to the carrier substrate by a plurality of support posts. The flexible display panel is removed from the carrier substrate and is electrically coupled with display components to form a flexible display system.

18 Claims, 17 Drawing Sheets

(56) References Cited

U.S. PATENT DOCUMENTS

| | | | |
|---|---|---|---|
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,165,863 B1 * | 1/2007 | Thomas et al. ............... 362/219 |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0087522 A1 * | 4/2005 | Sun et al. ............... 219/121.71 |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 | 12/2007 | Slater et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0242918 A1 | 10/2009 | Edmond et al. |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0244611 A1 | 10/2011 | Kim |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0070455 A1 * | 3/2013 | Tsui et al. ............... 362/235 |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0104793 A1 | 4/2014 | Park et al. |
| 2015/0169011 A1 | 6/2015 | Bibl et al. |

FOREIGN PATENT DOCUMENTS

| | | |
|---|---|---|
| JP | 11-142878 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 03/060986 A2 | 7/2003 |
| WO | WO 03/060986 A3 | 7/2003 |

(56) References Cited

FOREIGN PATENT DOCUMENTS

| WO | WO 2005-099310 A2 | 10/2005 |
|---|---|---|
| WO | WO 2011/123285 | 10/2011 |
| WO | WO 2014/030830 A1 | 2/2014 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID Oct. 8-12, 2006, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Mone, Gregory, "The Future is Flexible Displays," Communications of the ACM, Jun. 2013, 3 pgs. Article accessed Feb. 26, 2014 at http://cacm.acm.org/magazines/2013/6/164606-the-future-is-flexible-displays/fulltext.

PCT International Search Report and Written Opinion for International Application No. PCT/US2015/025873, mailed Jul. 17, 2015, 15 pages.

Takahashi, et al., "High Density LED Display Panel on Silicon Microreflector and Integrated Circuit," Proceedings of the (Japan) International Electronic Manufacturing Technology Symposium, New York, IEEE, Dec. 4, 1995, pp. 272-275.

\* cited by examiner

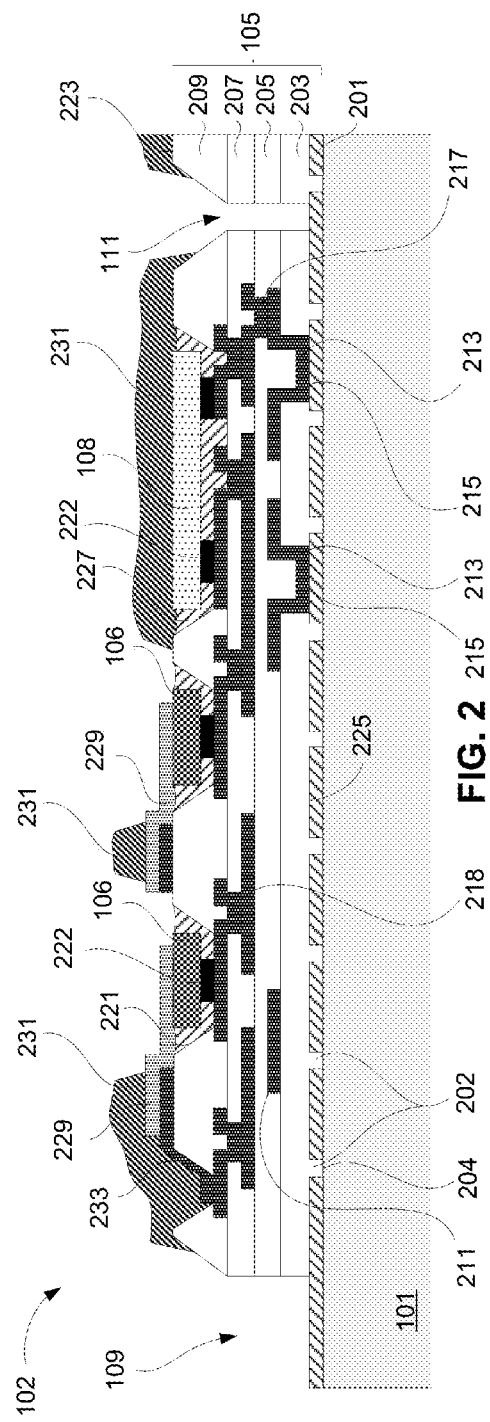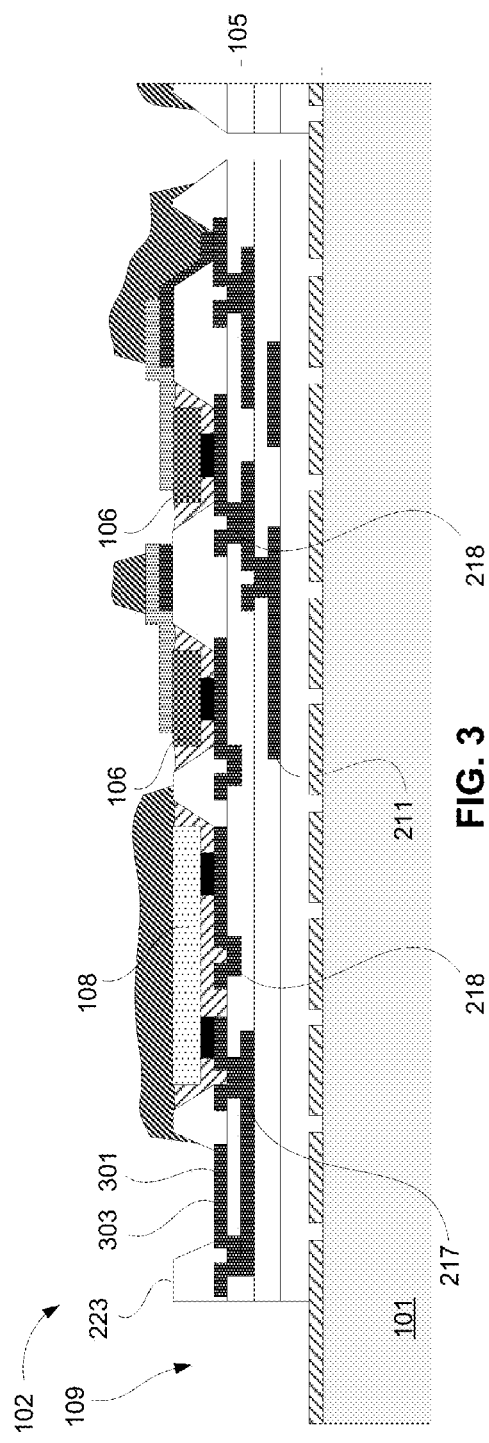

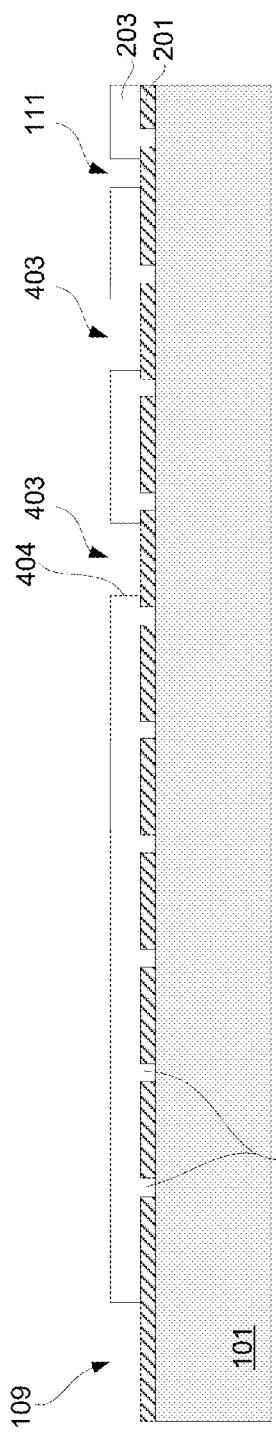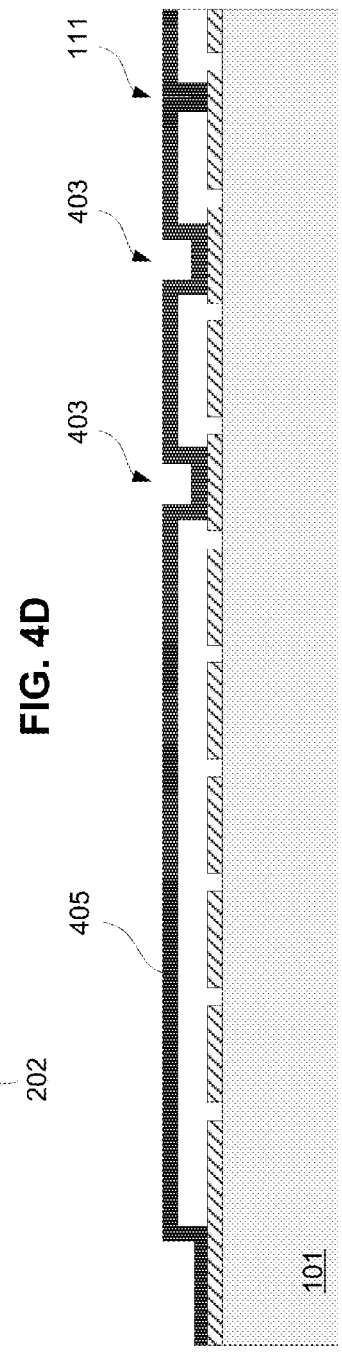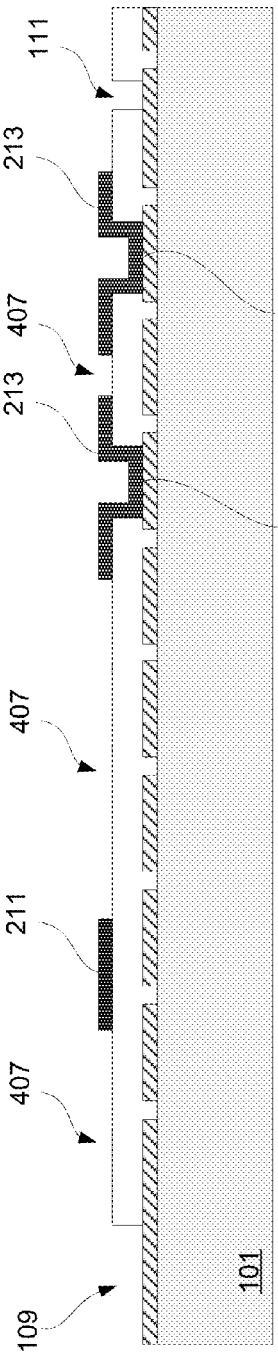

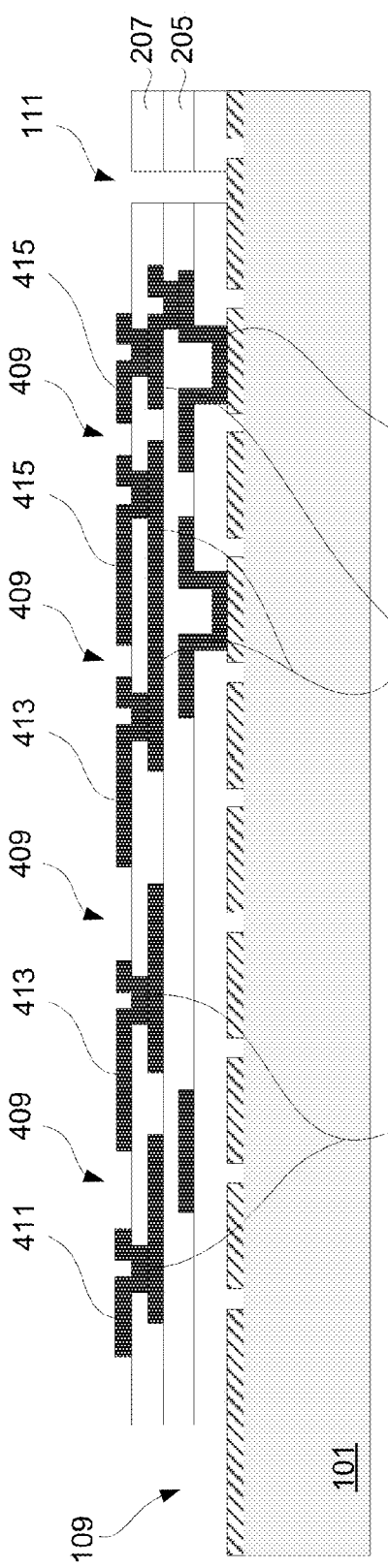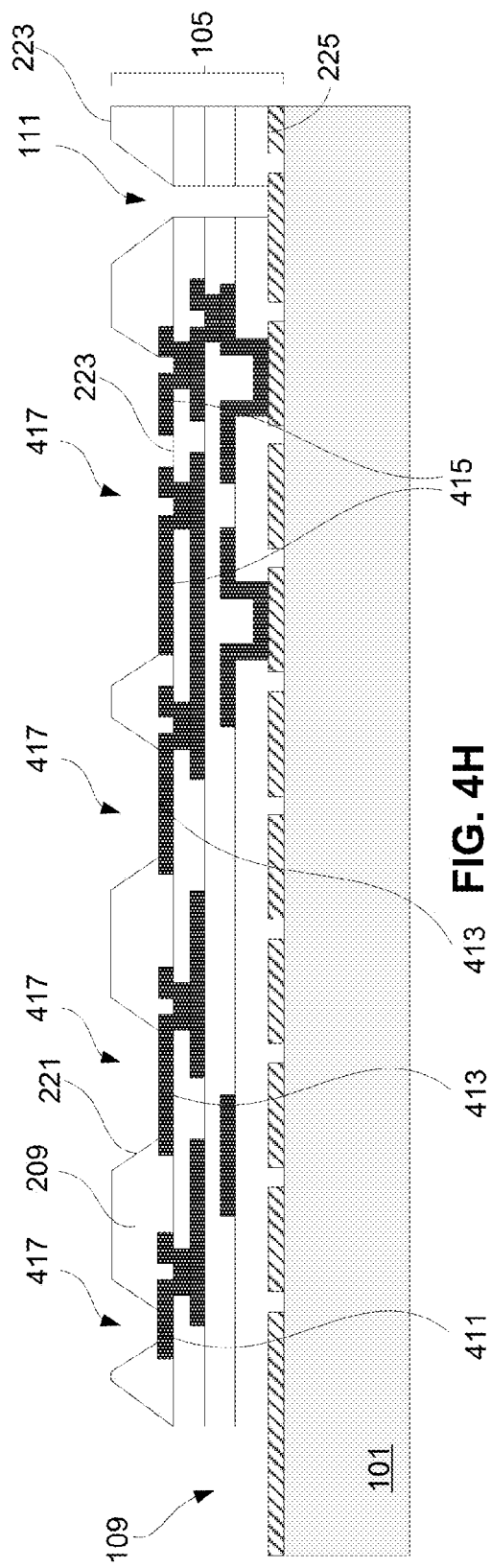

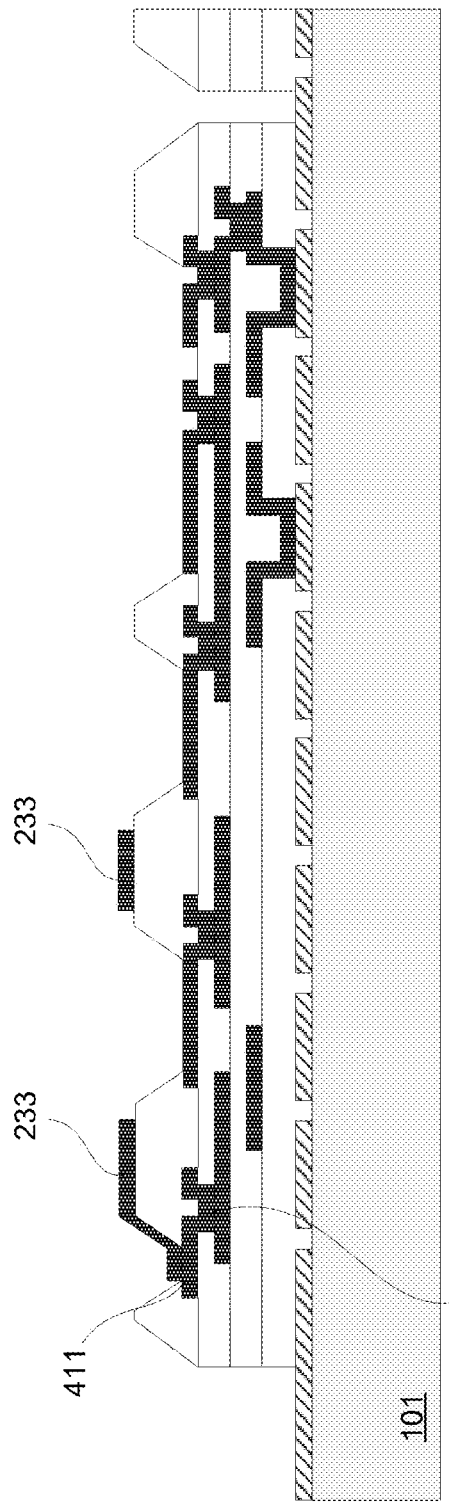
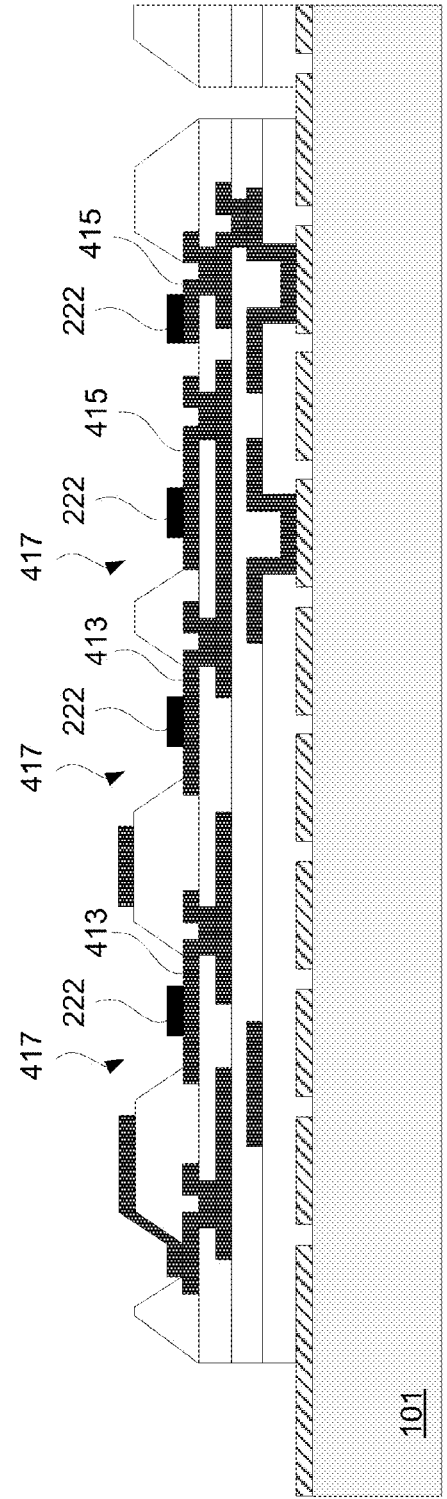
FIG. 4I
FIG. 4J

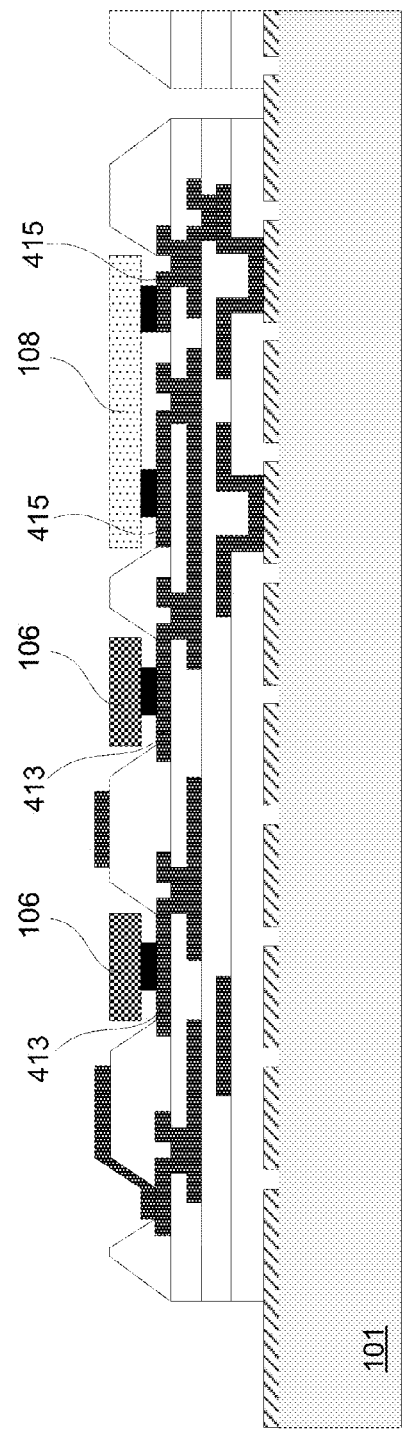
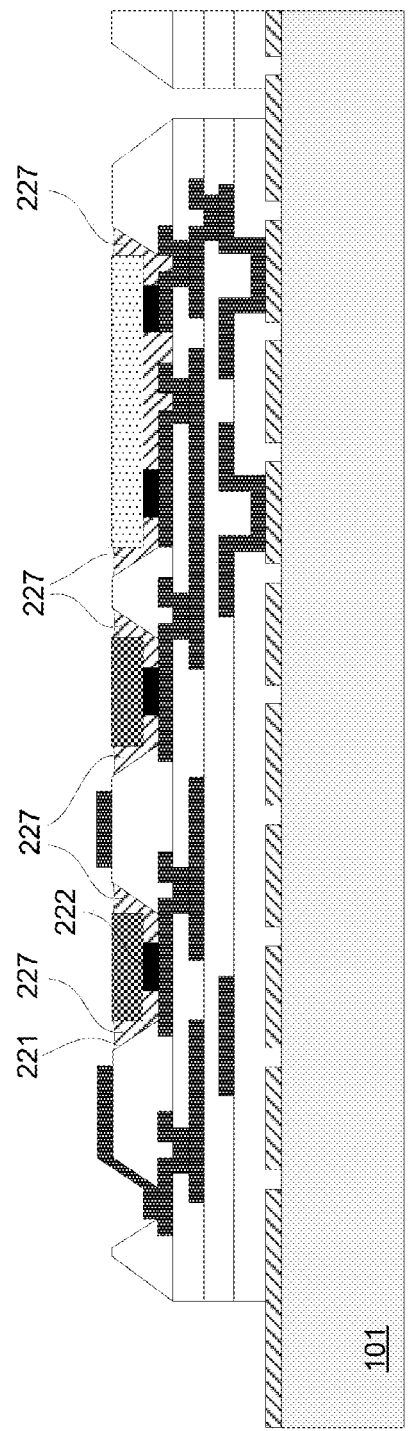
FIG. 4K
FIG. 4L

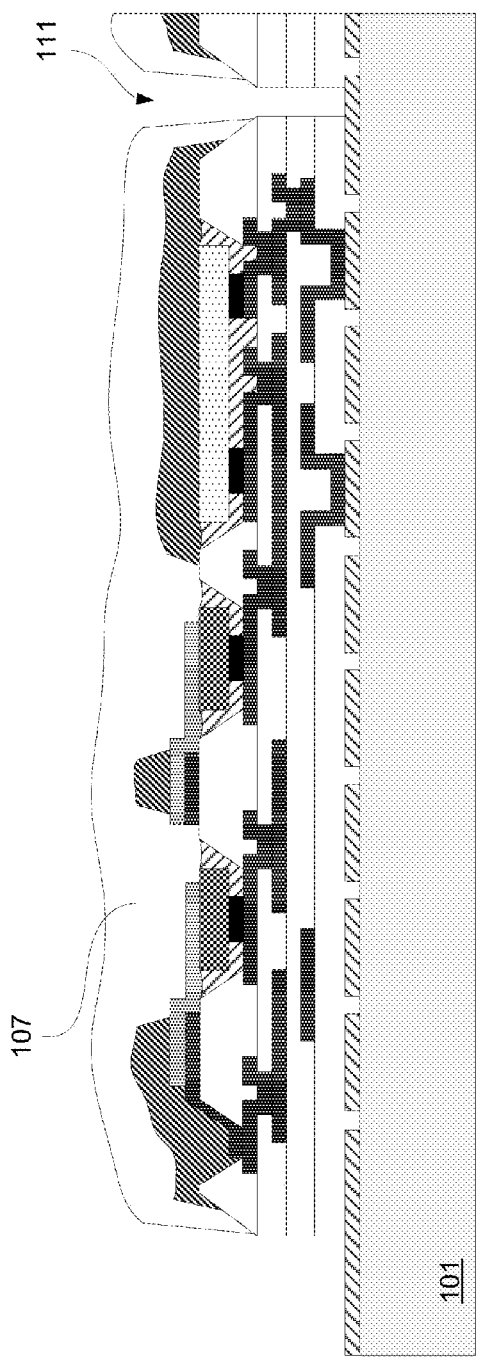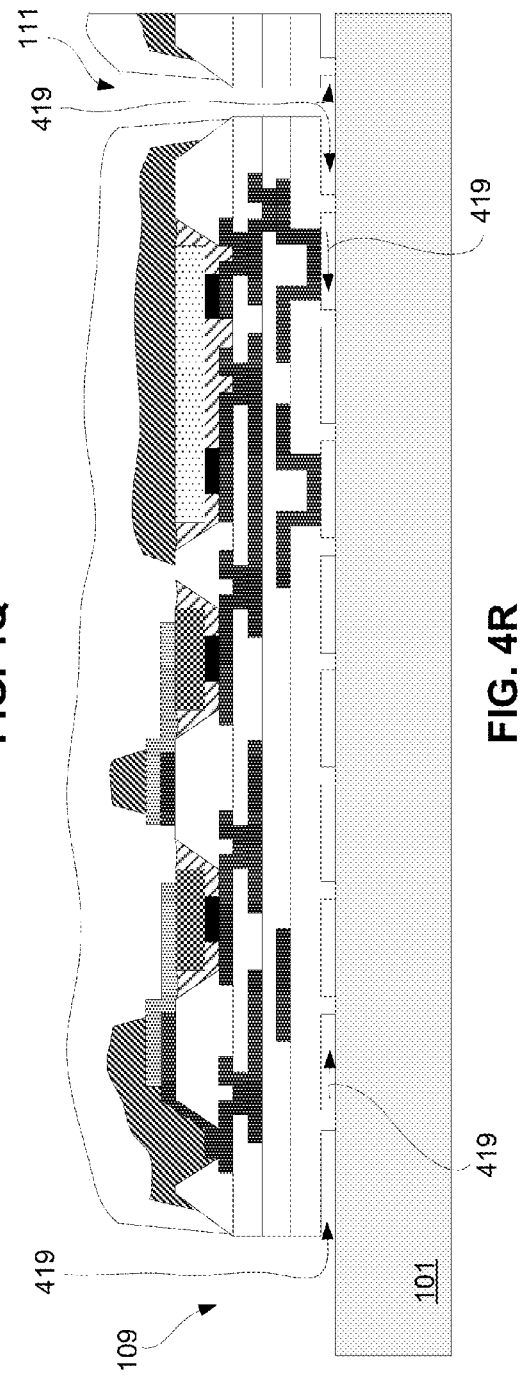

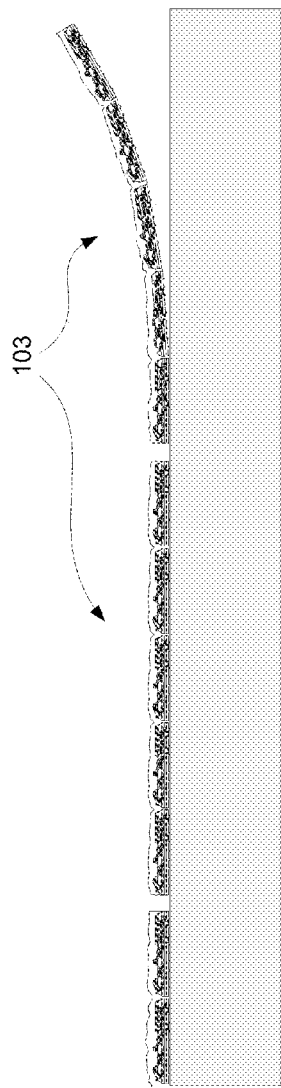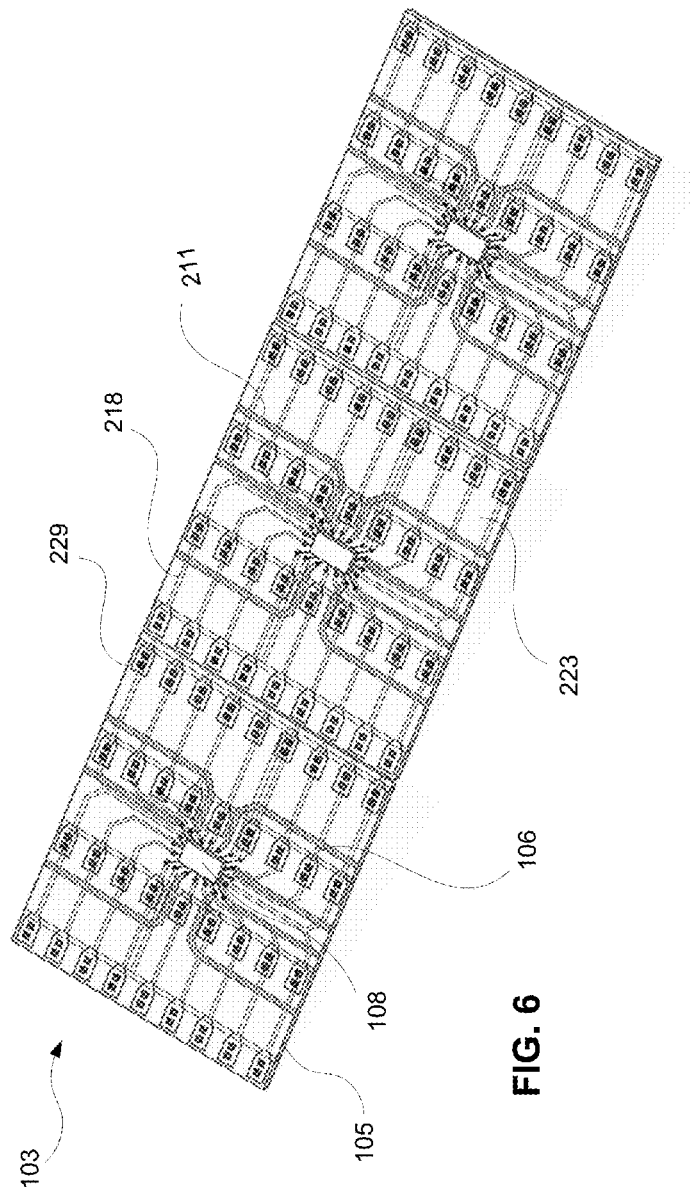
FIG. 5
FIG. 6

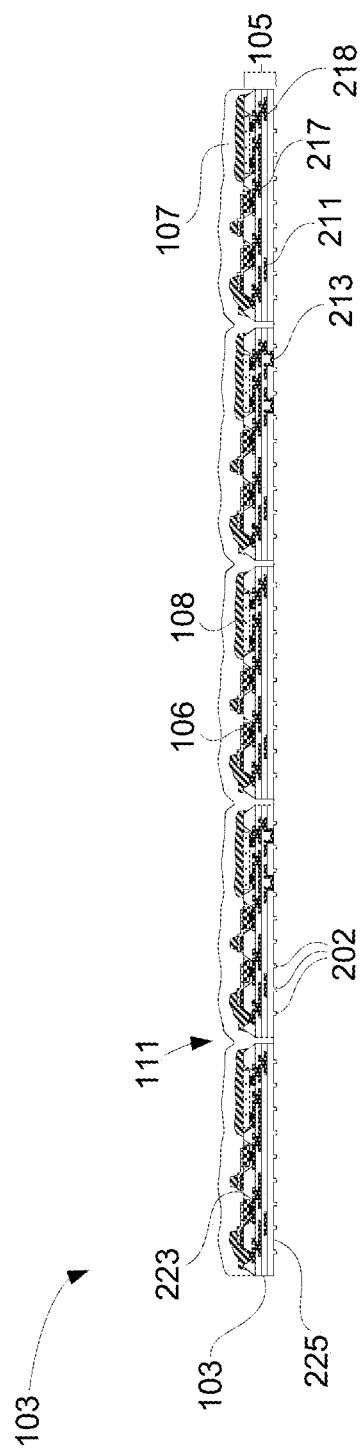
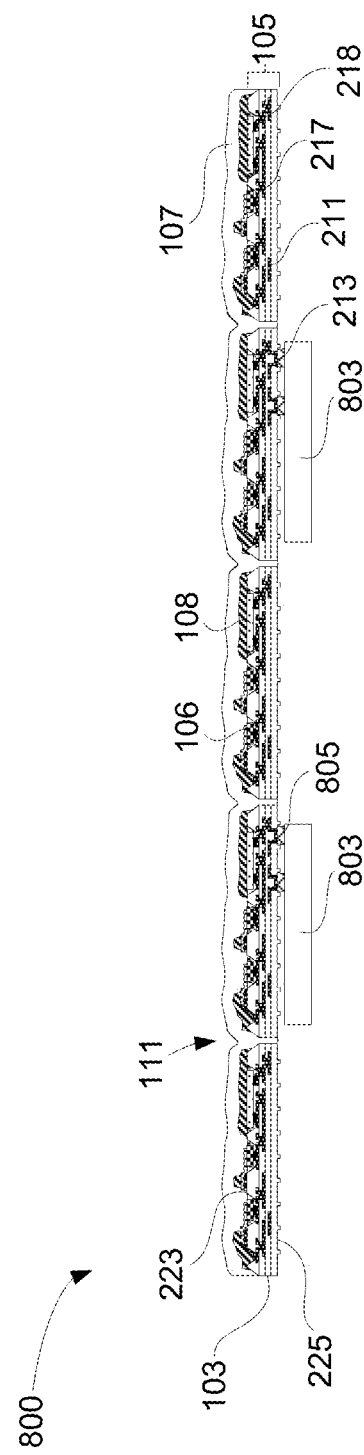
FIG. 7A
FIG. 7B

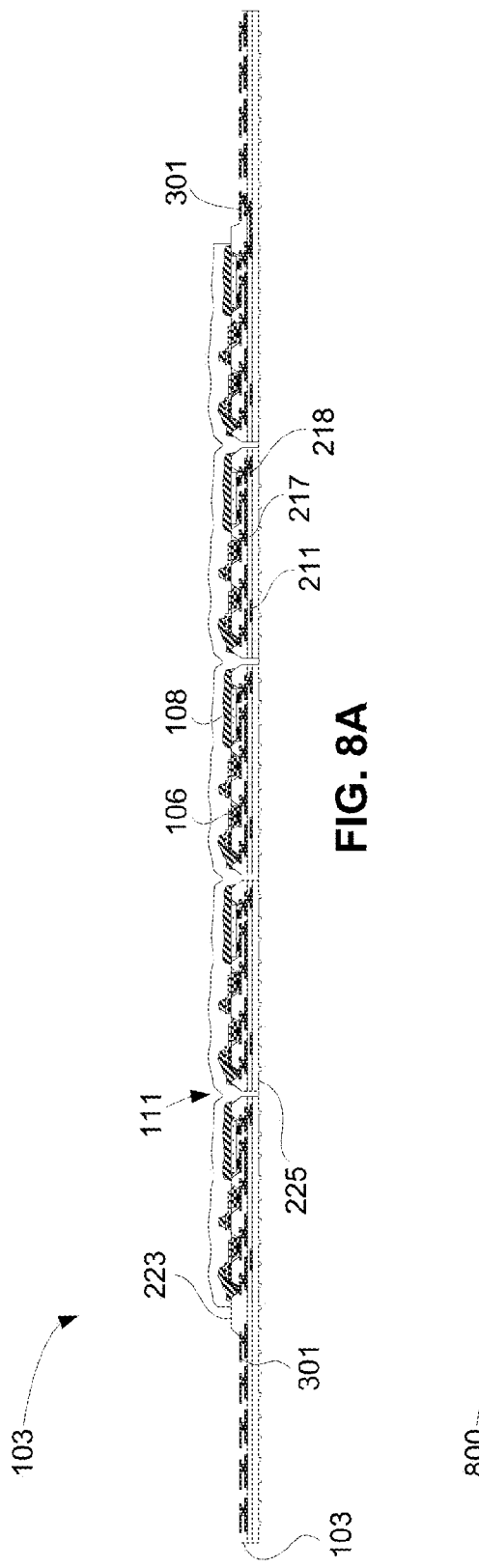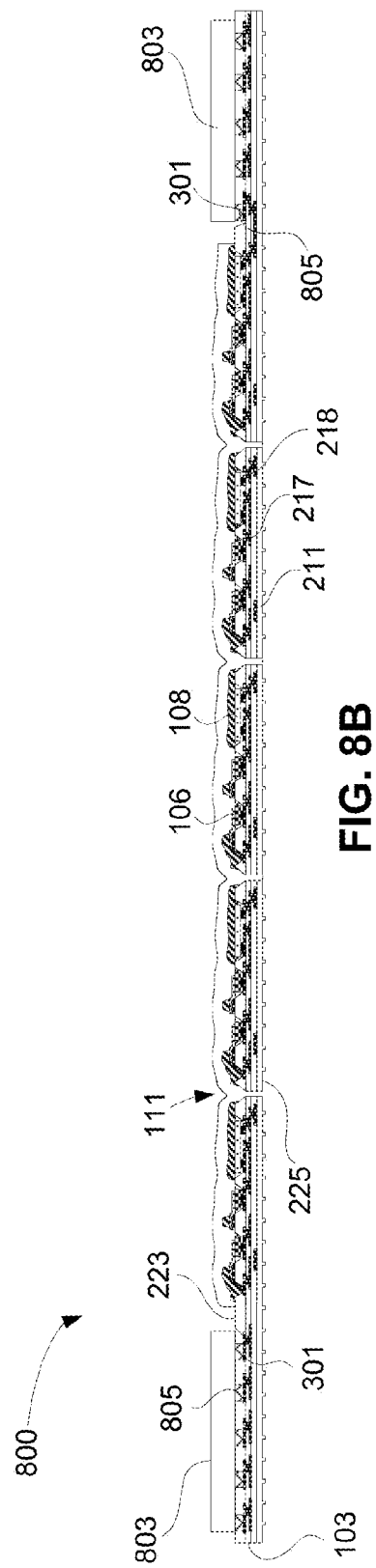

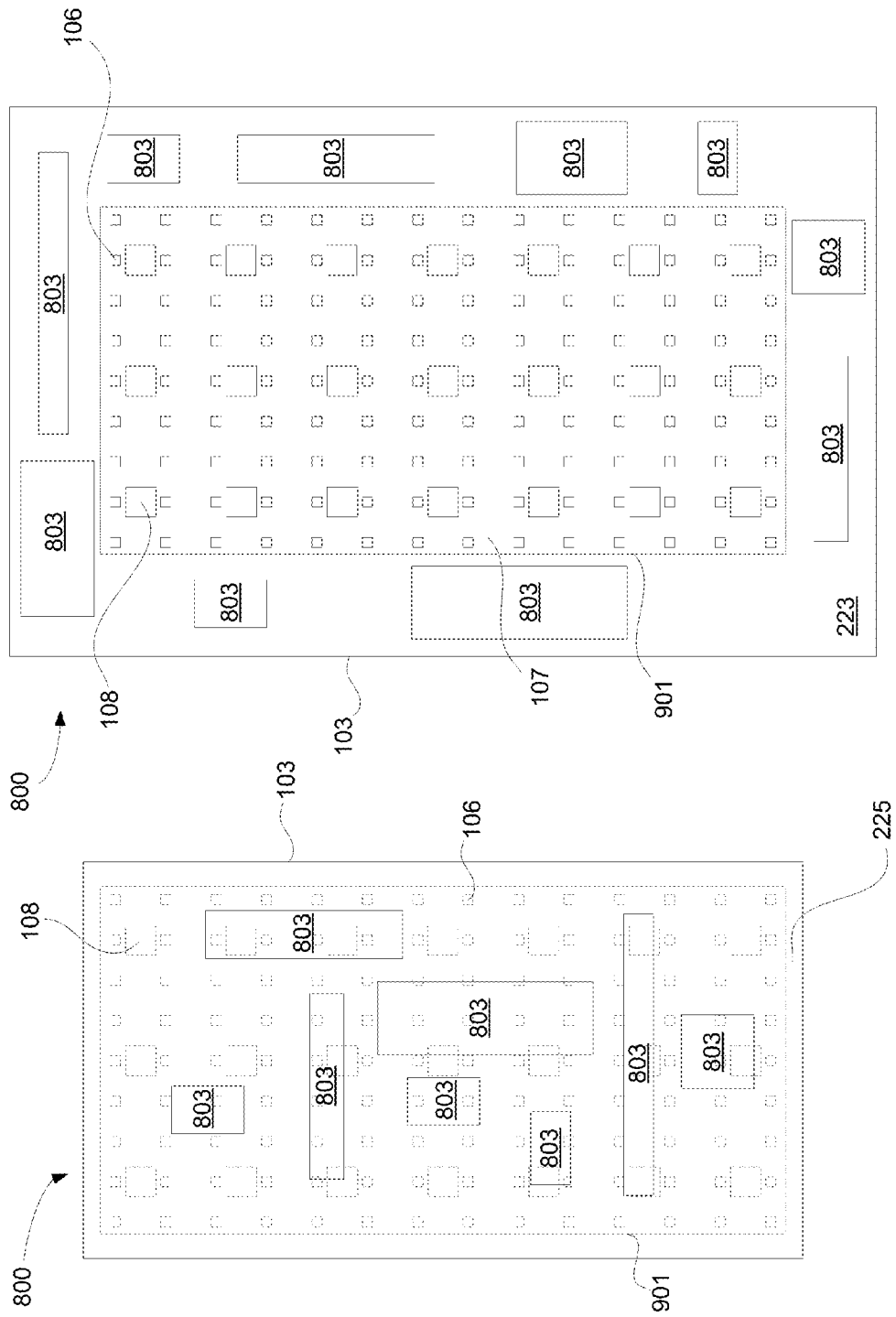

FLEXIBLE DISPLAY AND METHOD OF FORMATION WITH SACRIFICIAL RELEASE LAYER

BACKGROUND

1. Field

The present invention relates to display systems. More particularly embodiments of the present invention relate to flexible display systems having semiconductor microchips and LEDs on a flexible display substrate.

2. Background Information

Display panels are critical components in modern mobile electronic devices, such as smartphones, tablets, and laptop/notebook computers. Through recent development, flexible display panels are becoming a viable replacement for conventional rigid display panels. Flexible display panels are display panels that are not formed with a rigid substrate so that they can be curved and bent. Currently, organic light emitting diode (OLED) technology is widely adopted for forming flexible display panels. Typical OLED display panels are constructed from a glass substrate, on top of which are a circuit containing thin-film transistors and a capacitor, then the light emitting OLED devices and, finally, a transparent, protective layer on top. The thin-film transistor circuit is formed within the OLED display substrate and is subjected to constricting forces during curving and bending of the display. Furthermore, OLEDs need to be hermetically sealed because they are hypersensitive to oxygen and water.

SUMMARY OF THE INVENTION

A method and apparatus for flexible light emitting diode (LED) display panels are described. In one embodiment, the method includes forming a sacrificial layer on a carrier substrate. The method also includes forming a flexible display substrate on the sacrificial layer where the flexible display substrate includes a plurality of release openings that extend through the flexible display substrate to the sacrificial layer. Furthermore, the method includes transferring an array of LEDs and a plurality of microchips onto the flexible display substrate. In an embodiment, the flexible display substrate is formed by spinning on a photo-definable material. Additionally, in an embodiment, forming the flexible display substrate includes forming at least one photo-definable polymer layer and at least one metal layer. Forming the at least one metal layer may be performed by sputtering.

In an embodiment, the method further includes etching a plurality of openings in the sacrificial layer and forming the flexible display substrate on the sacrificial layer and within the openings to form a plurality of posts extending through the sacrificial layer. Additionally, in an embodiment, the method further includes selectively removing the sacrificial layer and separating the flexible display substrate from the carrier substrate. Selectively removing the sacrificial layer may be performed by a process selected from the group consisting of a vapor etching process and a plasma etching process. Additionally, in an embodiment, the method further includes forming a transparent contact for each LED in the array of LEDs, forming a black matrix layer on the flexible display substrate where the black matrix layer surrounds the array of LEDs, and covering the array of LEDs and the plurality of microchips with a protective material. Covering the array of LEDs may be performed by a process selected from the group consisting of a slit-coating process and a laminating process.

In an embodiment, a flexible display panel includes a flexible substrate including a front surface, a back surface, and a display area on the front surface. The flexible display panel also includes a plurality of interconnects that extend at least partially through the flexible substrate from the front surface to the back surface where the flexible substrate and the plurality of interconnects form a build-up structure. Further, the flexible display panel includes an array of light emitting diodes (LEDs) and a plurality of microchips on the front surface of the flexible display substrate in the display area and electrically coupled to the plurality of interconnects. A plurality of release openings may extend through the flexible substrate from the front surface to the back surface.

Each microchip of the plurality of microchips may include a driving circuit to drive one or more LEDs to emit light. In an embodiment, the plurality of microchips are electrically coupled to the array of LEDs. Additionally, in an embodiment, the flexible display panel further includes at least one display component electrically coupled to the array of microchips on the front surface of the flexible substrate through the plurality of interconnects, where the display component comprises a chip selected from the group consisting of a sense controller chip, a scan driver chip, a data driver chip, a processor chip, and a power supply. The display component may be on the back surface of the flexible substrate. Further, the display component may be on the front surface of the flexible substrate outside of the display area. In an embodiment, the build-up structure includes at least one layer of polymer and at least one layer of metal.

In an embodiment, a structure includes a carrier substrate, a flexible substrate on the carrier substrate where the flexible substrate includes a plurality of electrical interconnects that extend at least partially between a front surface and a back surface of the flexible substrate, and an array of LEDs and a plurality of microchips on the front surface of the flexible display substrate. The structure also includes a sacrificial release layer between the back surface of the flexible substrate and the carrier substrate within a display area on the front surface, and a plurality of release openings that extend through the flexible substrate from the front surface to the back surface and expose the sacrificial release layer. Additionally, in an embodiment, the back surface of the flexible substrate includes a plurality of support posts. Each support post of the plurality of support posts may be laterally surrounded by the sacrificial release layer. Further, the sacrificial layer may include a material selected from the group consisting of an oxide and a nitride.

BRIEF DESCRIPTION OF THE DRAWINGS

FIG. 2 is a cross-sectional side view illustration of a flexible display substrate with LEDs and microchips on a front surface of the flexible display substrate and component bond pads on a back surface of the flexible display substrate in accordance with an embodiment of the invention.

FIG. 3 is a cross-sectional side view illustration of a flexible display substrate with LEDs and microchips on a front surface of the flexible display substrate and component bond pads on the front surface of the flexible display substrate in accordance with an embodiment of the invention.

FIG. 5 is a cross-sectional side view illustration of a flexible display panel being separated from a carrier substrate in accordance with an embodiment of the invention.

FIG. 6 is a perspective view of a flexible display panel illustrating an arrangement of LEDs and microchips in accordance with an embodiment of the invention.

FIG. 7A is a cross-sectional side view illustration of a flexible display panel with back component bond pads after separation from a carrier substrate in accordance with an embodiment of the invention.

FIG. 7B is a cross-sectional side view illustration of a flexible display system including a flexible display panel and a plurality of display components mounted on a back surface of the flexible display panel in accordance with an embodiment of the invention.

FIG. 8A is a cross-sectional side view illustration of a flexible display panel with front component bond pads after separation from a carrier substrate in accordance with an embodiment of the invention.

FIG. 8B is a cross-sectional side view illustration of a flexible display system including a flexible display panel and a plurality of display components mounted on a front surface of the flexible display panel in accordance with an embodiment of the invention.

FIG. 9A is a schematic top view illustration of a back surface of a flexible display system including a flexible display panel and a plurality of display components mounted on a back surface of the flexible display panel in accordance with an embodiment of the invention.

FIG. 9B is a schematic top view illustration of a front surface of a flexible display system including a flexible display panel and a plurality of display components mounted on a front surface of the flexible display panel outside of a display area in accordance with an embodiment of the invention.

DETAILED DESCRIPTION OF THE INVENTION

Figure 1A:
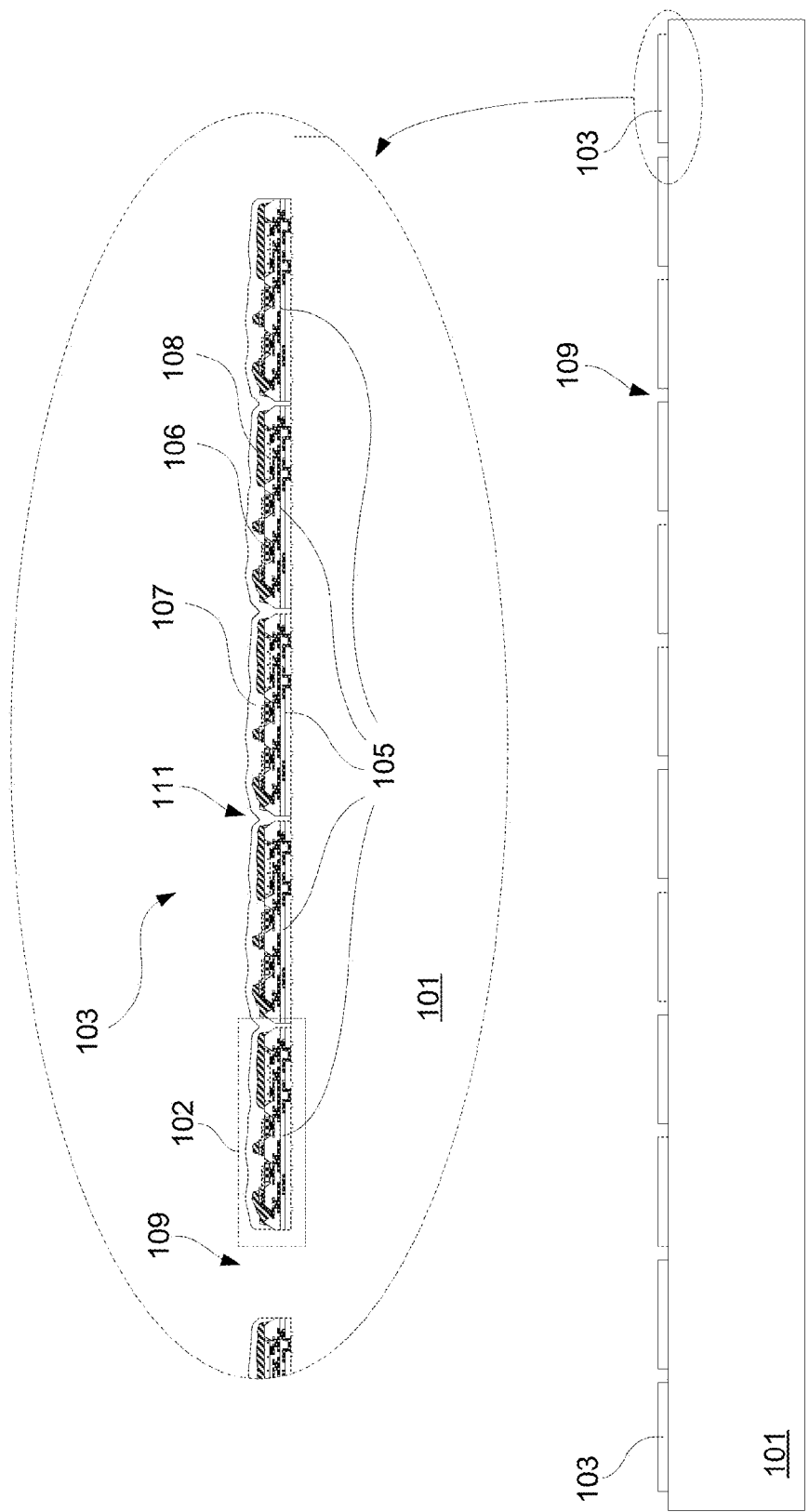
FIG. 1A is a cross-sectional side view illustration of an array of flexible display panels with covered release openings mounted on a carrier substrate in accordance with an embodiment of the invention.

Embodiments of the present invention describe flexible display systems and methods of manufacture thereof. In an embodiment, a method of manufacturing a flexible display system includes forming a sacrificial layer on a carrier substrate. A flexible display substrate is formed on the sacrificial layer, with a plurality of release openings that extend through the flexible display substrate to the sacrificial layer. In an embodiment, the flexible display substrate is formed using a photo-definable polymer. An array of light emitting diodes (LEDs) and a plurality of microchips are transferred onto the flexible display substrate to form a flexible display panel. The sacrificial layer is selectively removed such that the flexible display panel attaches to the carrier substrate by a plurality of support posts. The flexible display panel is removed from the carrier substrate and is electrically coupled with display components to form a flexible display system.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

Embodiments of the invention enable the fabrication of flexible display panels whose operation does not require them to be held in a rigid structure. In an embodiment, the flexible display panel described herein includes a flexible display substrate having an array of LEDs and a plurality of microchips on a front surface of the flexible display substrate within a display area. In an embodiment, the flexible display substrate is a build-up structure that has more than one layer of insulating material and more than one layer of conductive material. At least one layer of conductive material within the flexible substrate electrically couples the array of LEDs to the plurality of microchips. In an embodiment, bond pads are exposed on a back surface of the flexible display substrate to which display components electrically connect. Alternatively, in an embodiment, bond pads are exposed on the front surface of the flexible display substrate outside of a display area. The bond pads are electrically coupled to the plurality of microchips on the front surface of the flexible display substrate. The conductive material within the flexible substrate electrically couples the bond pads to the plurality of microchips.

In an embodiment, the flexible display panel is fabricated by forming a layer of sacrificial material on a carrier substrate. A plurality of openings is formed in the sacrificial layer, within which a portion of the flexible display substrate is formed. The portion of the flexible display substrate in the plurality of openings forms a plurality of posts that extends through the sacrificial layer. In an embodiment, the flexible display substrate is constructed by forming at least one layer of insulating material and one layer of conductive material. An array of LEDs and a plurality of microchips are then transferred onto a front surface of the flexible display substrate. In an embodiment, the array of LEDs and the plurality of microchips are transferred onto the flexible display substrate by mass transfer tools operating using electrostatic principles to pick up and transfer large arrays of LEDs and microchips. Electrostatic transfer enables driving circuitry to be located on the front surface of the flexible display substrate, rather than embedded within the flexible display substrate. The array of LEDs and the plurality of microchips are covered with a transparent material to protect it from physical, environmental, and/or electrical disturbance while allowing for the visualization of light emitted from the array of LEDs. In an embodiment, the flexible substrate containing the array of LEDs and the plurality of microchips is separated from the carrier substrate by selectively removing the sacrificial layer and pulling the display substrate away from the carrier substrate, resulting in a flexible display panel that can be integrated with additional display components to form a display system.

In an embodiment, a flexible display system includes a flexible display panel having an array of LEDs and a plurality of microchips on a front surface of the flexible display substrate. A plurality of display components is electrically coupled to the plurality of microchips through the flexible display substrate. In an embodiment, the plurality of display components is located on the back surface of the flexible display substrate directly behind the display area. The plurality of display components can include, but are not limited to, scan drivers, data drivers, sense controllers, write controllers, microcontrollers, and power supplies. Alternatively, in an embodiment, the plurality of display components is located on the front surface of the flexible display substrate outside of a display area. In an embodiment, the flexible display substrate is formed with one or more layers of insulating material and one or more layers of conductive material. The layered structure of the flexible display substrate allows the flexible display panel to bend in various directions and to various degrees while maintaining electrical connectivity between the display components, microchips, and LEDs. As such, the flexible display system is enabled to display images or sense light while being bent in various directions.

In accordance with some embodiments, the interactive display panel described herein is a micro LED active matrix display panel formed with semiconductor-based micro LEDs. Such a micro LED active matrix display panel utilizes the performance, efficiency, and reliability of semiconductor-based LEDs for emitting light. Furthermore, a micro LED active matrix display panel enables a display panel to achieve high resolutions, pixel densities, and subpixel densities due to the small size of the micro LEDs and microchips. In some embodiments, the high resolutions, pixel densities, and subpixel densities are achieved due to the small size of the micro LEDs and microchips.

For example, the term "micro" as used herein, particularly with regard to LEDs and microchips, refers to the descriptive size of certain devices or structures in accordance with embodiments. The term "micro" is meant to refer to the scale of 1 to 300 μm or, more specifically, 1 to 100 μm. In some embodiments, "micro" may even refer to the scale of 1 to 50 μm, 1 to 20 μm, or 1 to 10 μm. However, it is to be appreciated that embodiments of the present invention are not necessarily so limited, and that certain aspects of the embodiments may be applicable to larger, and possibly smaller size scales. For example, a 55 inch interactive television panel with 1920×1080 resolution, and 40 pixels per inch (PPI) has an approximate RBG pixel pitch of (634 μm×634 μm) and subpixel pitch of (211 μm×634 μm). In this manner, each subpixel contains one or more micro LEDs having a maximum width of no more than 211 μm. Furthermore, where real estate is reserved for microchips in addition to micro LEDs, the size of the micro LEDs may be further reduced. For example, a 5 inch interactive display panel with 1920×1080 resolution, and 440 pixels per inch (PPI) has an approximate RBG pixel pitch of (58 μm×58 μm) and subpixel pitch of (19 μm×58 μm). In such an embodiment, not only does each subpixel contain one or more micro LEDs having a maximum width of no more than 19 μm, in order to not disturb the pixel arrangement, each microchip may additionally be reduced below the pixel pitch of 58 μm. Accordingly, some embodiments combine with efficiencies of semiconductor-based LEDs for emitting light with the scalability of semiconductor-based LEDs, and optionally microchips, to the micro scale for implementation into high resolution and pixel density applications.

FIG. 1A is a cross-sectional side view illustration of a plurality of flexible display panels 103 with covered release openings 111 mounted on a carrier substrate 101 in accordance with an embodiment of the invention. The illustrated embodiment depicts the plurality of flexible display panels 103 after removal of the sacrificial layer and before separation from the carrier substrate 101. As shown in FIG. 1A, the flexible display panels 103 have multiple sections 102 that will be described in more detail when discussing the method of forming the flexible display panel 103 below. The plurality of flexible display panels 103 is on the carrier substrate 101. In an embodiment, the carrier substrate 101 is any suitable substrate, such as glass, upon which the flexible display panel 103 can be formed. In embodiments, the carrier substrate 101 is rigid enough to withstand process forces associated with the transfer of the array of LEDs and the plurality of microchips to the flexible display panel 103 with an electrostatic transfer head. In an embodiment, the carrier substrate 101 is formed of a material that can be reused for making new batches of flexible display panels 103. Each flexible display panel 103 is separated from adjacent flexible display panels by a trench 109. The trench 109 physically separates each flexible display panel 103 so that each flexible display panel 103 can be removed individually without interfering or damaging an adjacent flexible display panel. In an embodiment, the flexible display panel 103 includes a flexible substrate 105 formed from at least one layer of insulating material and at least one layer of conductive material. In an embodiment, the insulating material is a polymer. Alternatively, in an embodiment, the insulating material is a photo-definable polymer, such as an acrylic or an SU-8 photoresist (i.e., an epoxy photoresist). In a particular embodiment, the flexible substrate 105 is formed of at least one layer of photo-definable polyimide and at least one layer of metal. Although any insulating material may be used in embodiments, polyimide and metal may be a viable combination because of its ease of use and cost effectiveness. An array of LEDs 106 and a plurality of microchips 108 are located on the flexible display substrate 105. A transparent protective layer 107 is formed over the array of LEDs, plurality of microchips, and exposed top surfaces of the flexible display substrate 105. In an embodiment, the transparent protective layer 107 is polymethyl methacrylate (PMMA) or acrylic glass. Furthermore, a plurality of release openings 111 extends through the flexible display substrate 105. The release openings 111 and trenches 109 provide channels within which an etchant may flow to remove the sacrificial layer as will be discussed further below. In this embodiment, the release openings 111 are covered by the transparent protective layer 107 so that holes do not extend through the flexible display panel 103.

Figure 1B:
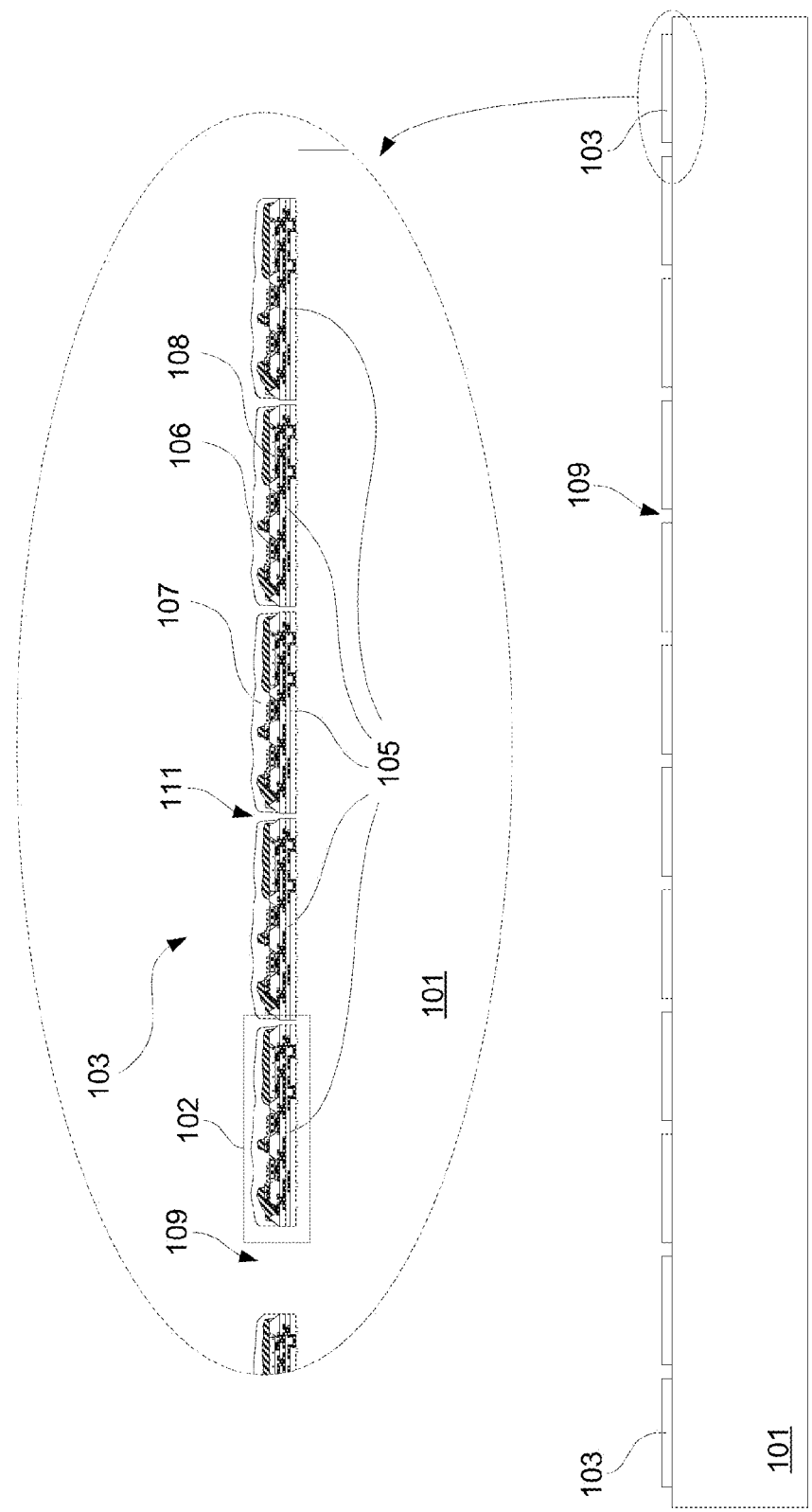
FIG. 1B is a cross-sectional side view illustration of an array of flexible display panels with exposed release openings mounted on a carrier substrate in accordance with an embodiment of the invention.

FIG. 1B is a cross-sectional side view illustration of an array of flexible display panels 103 with exposed release openings 111 mounted on a carrier substrate 101 in accordance with an embodiment of the invention. The illustrated embodiment depicts the plurality of flexible display panels 103 after removal of the sacrificial layer and before separation from the carrier substrate 101. The plurality of flexible display panels 103 is on the carrier substrate 101. Each flexible display panel 103 is separated from adjacent flexible display panels by a trench 109. The trench 109 physically separates each flexible display panel 103 so that each flexible display panel 103 can be removed individually without interfering or damaging an adjacent flexible display panel. An array of LEDs 106 and a plurality of microchips 108 are located on the flexible display substrate 105. A transparent protective layer 107, such as PMMA, is formed over the array of LEDs, plurality of microchips, and exposed top surfaces of the flexible display substrate 105. Furthermore, a plurality of release openings 111 extends through the flexible display substrate 105. The release openings 111 provide a channel within which an etchant may flow to remove the sacrificial layer as will be discussed further below. In this embodiment, the transparent protective layer 107 does not cover the release openings 111. Rather, an opening is formed through the transparent protective layer 107 and the release openings 111. Accordingly, the plurality of exposed release openings 111 creates a perforated flexible display panel 103.

Figure 1C:
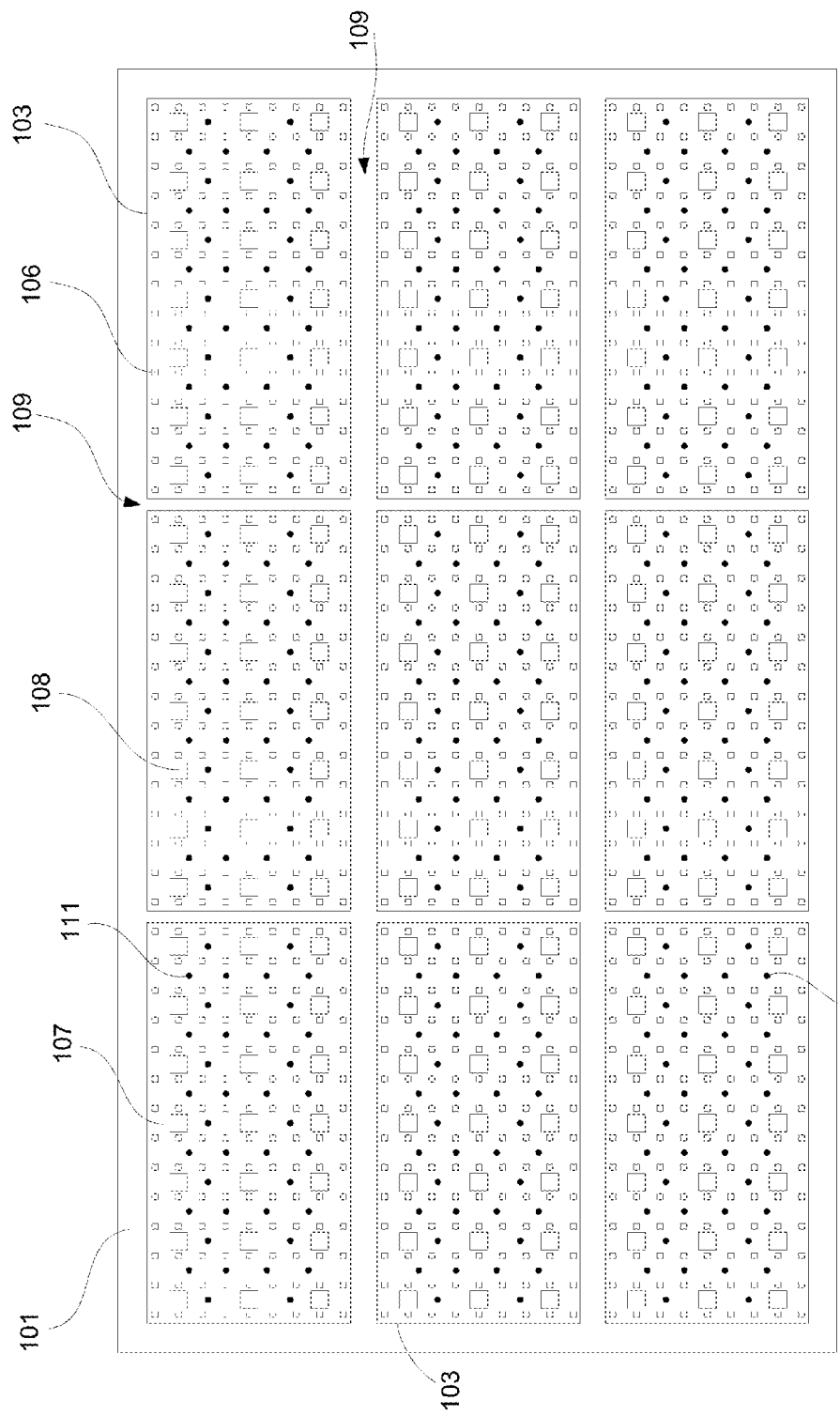
FIG. 1C is a schematic top view illustration of an array of flexible display panels with exposed release openings mounted on a carrier substrate in accordance with an embodiment of the invention.

FIG. 1C is a schematic top view illustration of an array of flexible display panels 103 with release openings 111 mounted on a carrier substrate 101 in accordance with an embodiment of the invention. Each flexible display panel 103 is separated from another flexible display panel by vertical and horizontal trenches 109. Interspersed within the array of LEDs 106 is the plurality of microchips 108. The plurality of microchips 108 controls the emission and/or sensing of the array of LEDs. The transparent protective layer 107 covers the array of LEDs 106 and the plurality of microchips 108 to protect them from damage or electrical interference. Furthermore, the array of LEDs 106 are covered with a transparent protective layer 107 to allow light to be emitted or sensed from the array of LEDs 106. The plurality of release openings 111 is located within the inner area of the flexible display panels 103. In an embodiment, the release openings 111 are covered release openings. Alternatively, in an embodiment, the release openings 111 are uncovered release openings. Release openings 111 allow etchants to remove the sacrificial layer located directly below the flexible display panel 103. In an embodiment, the release openings 111 are equidistant from one another to so that etchants have the same amount of distance to travel between each release opening 111. Alternatively, the release openings 111 may be designed to have a higher concentration or larger size in areas that are more difficult for etchants to reach, e.g., at locations farther away from trenches 109. In an embodiment, release openings 111 enable the complete removal of sacrificial material below the flexible display substrates 103.

FIG. 2 is a cross-sectional side view illustration of a flexible display substrate 105 with LEDs 106 and microchips 108 on a front surface of the flexible display substrate 105 and back component bond pads 213 on a back surface 225 of the flexible display substrate 105 in accordance with an embodiment of the invention. The illustration in FIG. 2 depicts a section 102 of the flexible display panel 103 and does not show a cross-section of the whole flexible display 103. In an embodiment, the flexible display substrate 105 is formed on a carrier substrate 101, which may be formed of glass.

In an embodiment, the flexible display substrate 105 is formed from at least one layer of insulating material and at least one layer of conductive material. In an embodiment, the insulating material is a polymer. Alternatively, in an embodiment, the insulating material is a photo-definable polymer, such as an acrylic or an SU-8 photoresist. In a particular embodiment, the insulating material is a photo-definable polyimide and the conductive material is a metal. As depicted in FIG. 2, the flexible display substrate 105 is formed from more than one insulating layers 203, 205, 207, and 209 and more than one conductive layer 211, 217, and 218. Although the embodiment depicted in FIG. 2 illustrates four layers of insulating materials and three layers of conductive materials, embodiments of the present invention are not limited to such arrangements. The insulating layers 203, 205, 207, and 209 are layered with the conductive layers 211, 217, and 218 to form a build-up structure in one embodiment. The build-up structure is a series of insulating layers with interconnect structures and conductive lines formed within. The interconnect structures electrically couple conductive lines to one another to form larger interconnect systems that span multiple layers. In an embodiment, the insulating layers 203, 205, 207, and 209 are in the range of 2 to 2.5 µm thick to provide structural strength and sufficient electrical isolation between conductive layers when the flexible display panel is bent. The conductive layers 211, 217, and 218 are structured so that the back surface 225 of the flexible display substrate 105 is electrically coupled to the front surface 223 of the flexible display substrate 105.

In an embodiment, the front surface 223 of the flexible display substrate 105 includes a plurality of wells with side surfaces 221 in which the LEDs 106 and microchips 108 are transferred. Although FIG. 2 depicts the LEDs 106 and the microchips 108 in wells, embodiments are not limited to such arrangements. For example, the front surface 223 of the flexible display substrate 105 may not have a plurality of wells, but rather have a flat surface upon which the LEDs and microchips are transferred. In an embodiment, the microchips 108 are electrically coupled to the LEDs through at least one of the conductive layers 211, 217, and 218 within the flexible display substrate 105. In an embodiment, the microchips 108 are electrically coupled to the back surface 225 of the flexible display substrate 105 through the conductive layers 211, 217, and 218. The back surface 225 of the flexible display substrate 105 includes back component bond pads 213 having back component bonding surfaces 215 for electrical coupling to display components as will be discussed further below. A transparent top contact 229 is located on the LEDs 106 to form an electrical connection between the LEDs 106 and a ground electrode (Vss) 233. The transparency of the top contact 229 allows light emitting to or from the LEDs 106 to easily pass through the top contact 229. The transparent contact 229 may be formed from any suitable transparent and conductive material, such as indium tin oxide (ITO) in one embodiment. As such, during operation, positive voltage may be applied by the microchip 108 to forward bias the LEDs 106, whose cathode electrode is grounded by the transparent top contact 229 and the metal ground electrode 223. It is to be appreciated that forward biasing the LEDs is but only one exemplary operation, to which other embodiments are not limited. For instance, the LEDs 106 may be reverse biased to sense light.

To ensure stability and protection of the electric connection to the LEDs 106, a sidewall passivation material 227 is located between the sidewalls 221 of the wells and the LEDs 106. The sidewall passivation material 227 stabilizes the LEDs 106 and prevents particles from falling underneath the LEDs 106. Additionally, the sidewall passivation material 227 passivates sidewalls of the LEDs to prevent shorting of an active layer as well as provides step coverage for structures (e.g., metal contacts, transparent acrylics, transparent oxides, and/or transparent polymers, such as those that may form top contact 229) formed upon it. In an embodiment, a black matrix layer 231 is formed over the front surface 225 of the flexible display substrate 105. The black matrix layer 231 may absorb all wavelengths of visible light to prevent light from bleeding between adjacent LEDs. Accordingly, the black matrix layer 231 may mitigate any self-generated light disturbance within the flexible display panel 103 while the flexible display panel 103 is displaying an image.

In an embodiment, a sacrificial layer 201 is formed in between the carrier substrate 101 and the flexible display substrate 105. The sacrificial layer 201 may be formed from any suitable material that can be etched selective to the flexible display substrate 105 and the carrier substrate 101. In an embodiment, the sacrificial layer 201 is formed from silicon dioxide. The sacrificial layer 201 acts as a support layer for the fabrication of the flexible display panel 103 as well as an adhesive to secure the flexible display substrate 105 during fabrication. The sacrificial layer 201 may be selectively removed to allow separation of the flexible display panel 103 from the carrier substrate 101. In an embodiment, a plurality of posts 202 extends through the sacrificial layer 201 to support the flexible display panel 103 after removal of the sacrificial layer 201. The posts 202 are a portion of the flexible display substrate 105 extending from the back surface 225 of the flexible display substrate 105. The bottom surface 204 of the posts 202 adhere to the carrier substrate 101 until the flexible display panel 103 is separated. In an embodiment, the structure of the posts 202 affects adhesion strength between the flexible display panel 103 and the carrier substrate 101 as well as the amount of force required to separate the flexible display panel 103 from the carrier substrate 101. Wider posts 202 increase the adhesion strength and the required separation force due to an increase in surface area that makes contact with the carrier substrate 101. In addition to the size of the posts 202, the number of posts 202 affects adhesion strength and separation force as well. An increase in the number of posts 202 increases the surface area adhered to the carrier substrate 101. As such, an increase in posts 202 increases the adhesion strength and the required force to separate the flexible display panel 103 from the carrier substrate 101.

Trenches 109 are at the ends of the flexible display panel 103. In an embodiment, the sacrificial layer 201 extends from underneath the flexible display substrate 105 and forms a layer across the bottom of the trench 109. Alternatively, in an embodiment, the sacrificial layer 201 does not extend from underneath the flexible display substrate 105. The trenches 109 expose the sacrificial layer 201 such that etchants may reach the sacrificial layer 201. Furthermore, in an embodiment, release openings 111 are formed through the flexible display substrate 105 to expose the sacrificial layer 201. The release openings 111 form a passageway for etchants to reach the sacrificial layer 201.

FIG. 3 is a cross-sectional side view illustration of a flexible display substrate 105 with LEDs 106 and microchips 108 on a front surface 223 of the flexible display substrate 105 and front component bond pads 301 on the front surface 223 of the flexible display substrate 105 in accordance with an embodiment of the invention. In an embodiment, the front component bond pads 301 are electrically coupled to the microchip 108 for sending electrical signals to the microchips 108. A top surface 303 of the front component bond pad 301 is exposed to allow a display component to make electrical connection to the microchip 108 through at least one of the conductive layers 211, 217, and 218. Having the front component bond pads 301 on the front surface 223 of the flexible display substrate 105 allow display components to be placed on the front surface 223 of the flexible display panel 103 outside of a display area.

Trenches 109 are at the ends of the flexible display panel 103. The trenches 109 expose the sacrificial layer 201 such that etchants may reach the sacrificial layer 201. Furthermore, in an embodiment, release openings 111 are formed through the flexible display substrate 105 to expose the sacrificial layer 201. The release openings 111 form a passageway for etchants to reach the sacrificial layer 201.

Figure 4A:
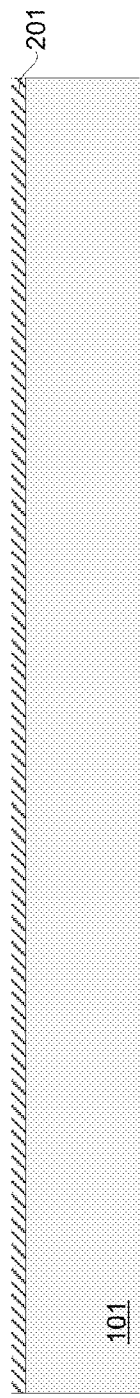
FIGS. 4A-4P illustrate a method of fabricating a flexible display panel including a flexible display substrate with arrays of LEDs and microchips on a front surface of the flexible display substrate and a plurality of covered release openings in accordance with an embodiment of the invention.
Figure 4B:
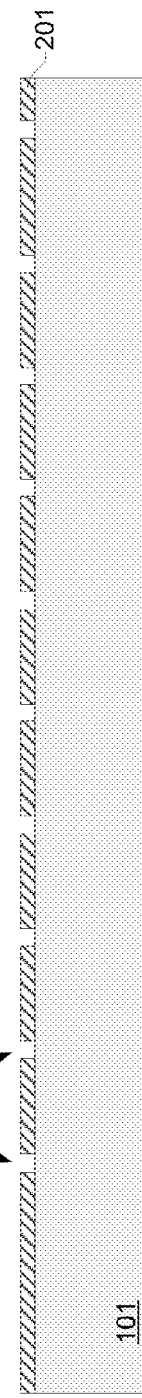
FIGS. 4Q-4S illustrate a method of fabricating a flexible display panel including a flexible display substrate with arrays of LEDs and microchips on a front surface of the flexible display substrate and a plurality of exposed release openings in accordance with an embodiment of the invention.
Figure 4C:
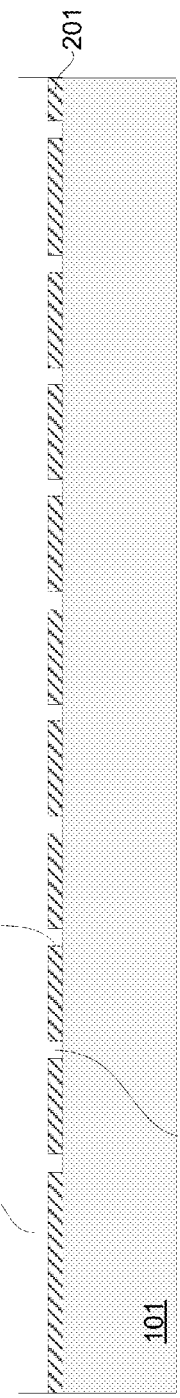
Figure 4M:
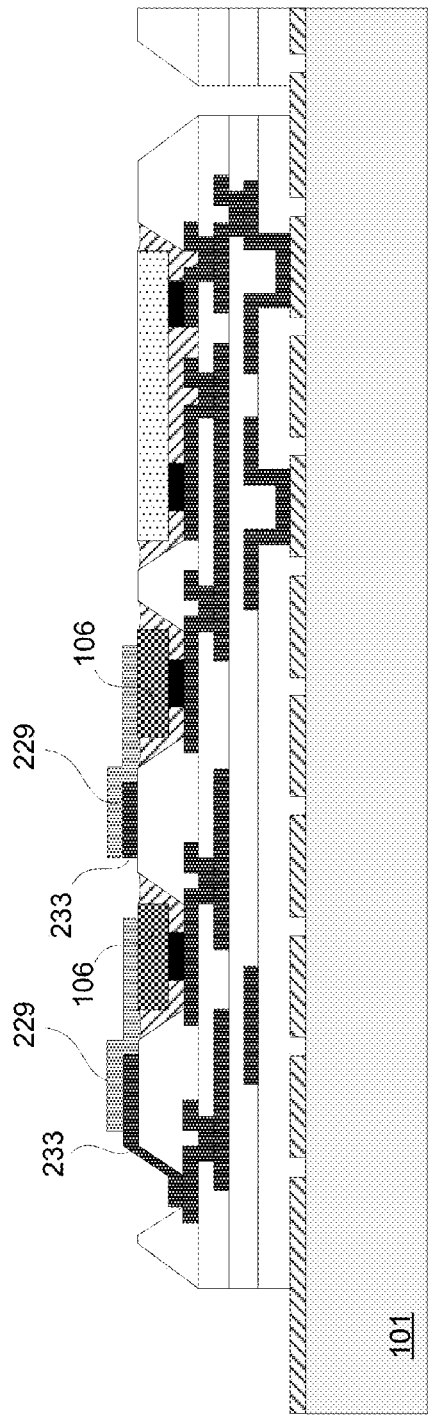
Figure 4N:
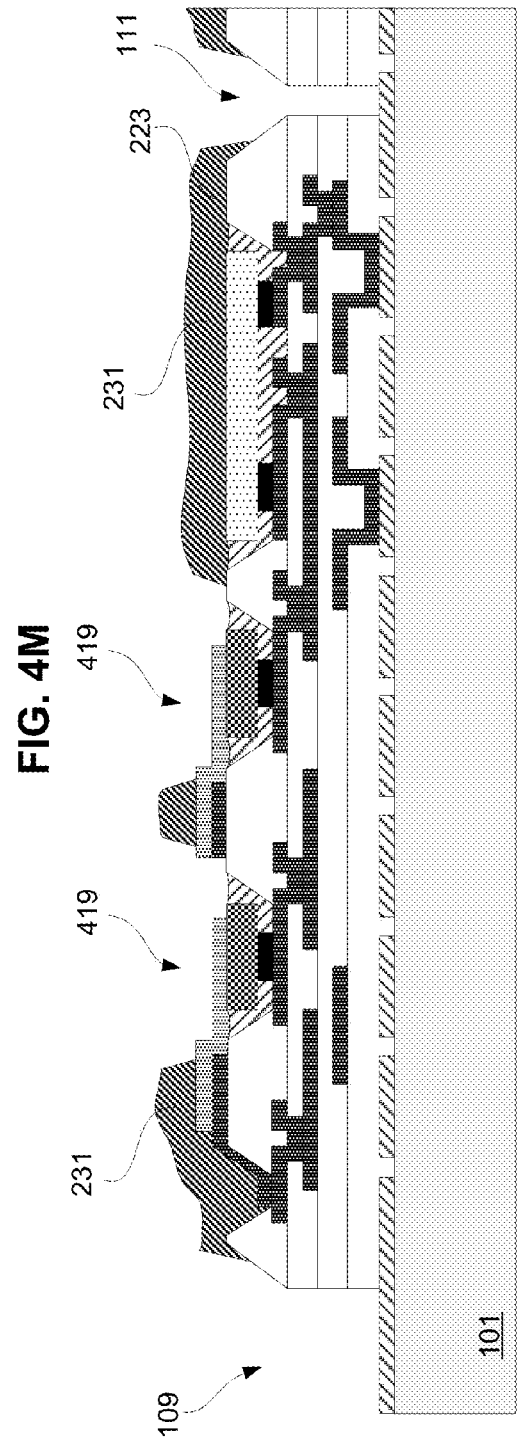
Figure 4O:
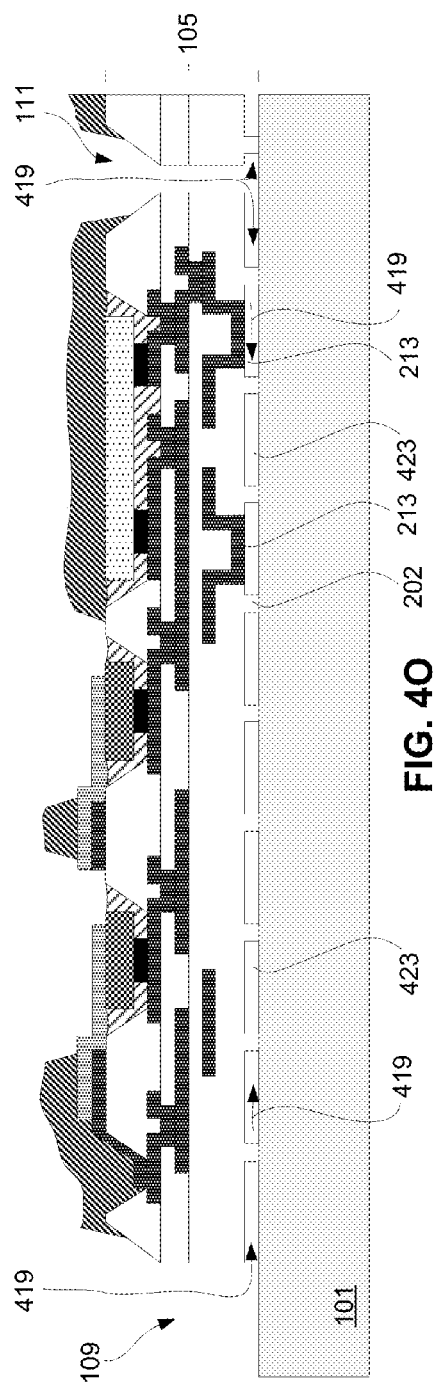
Figure 4P:
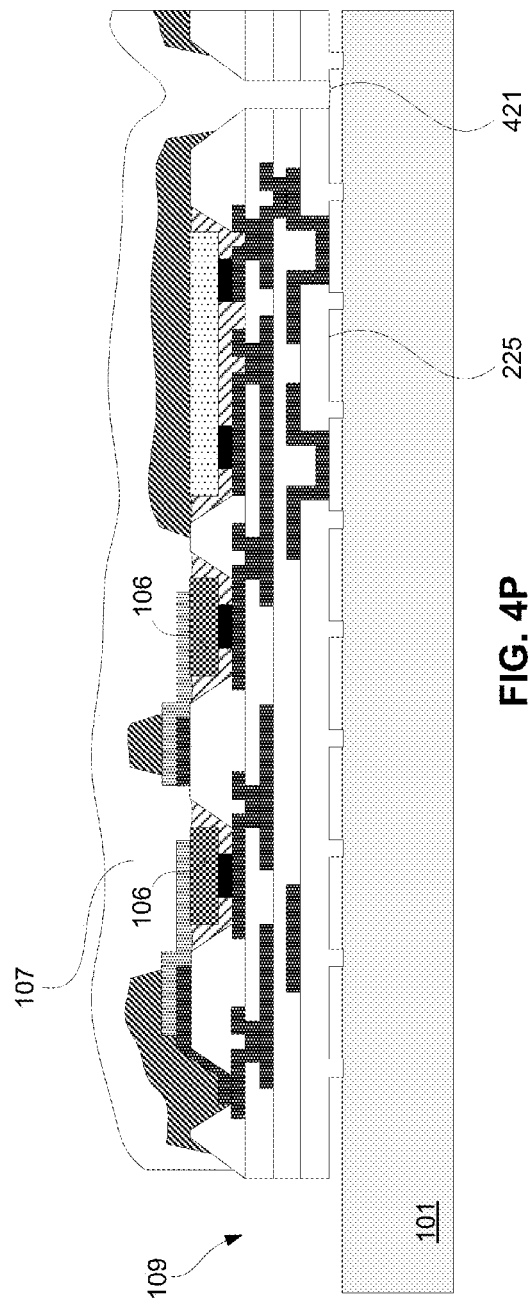
Figure 4S:
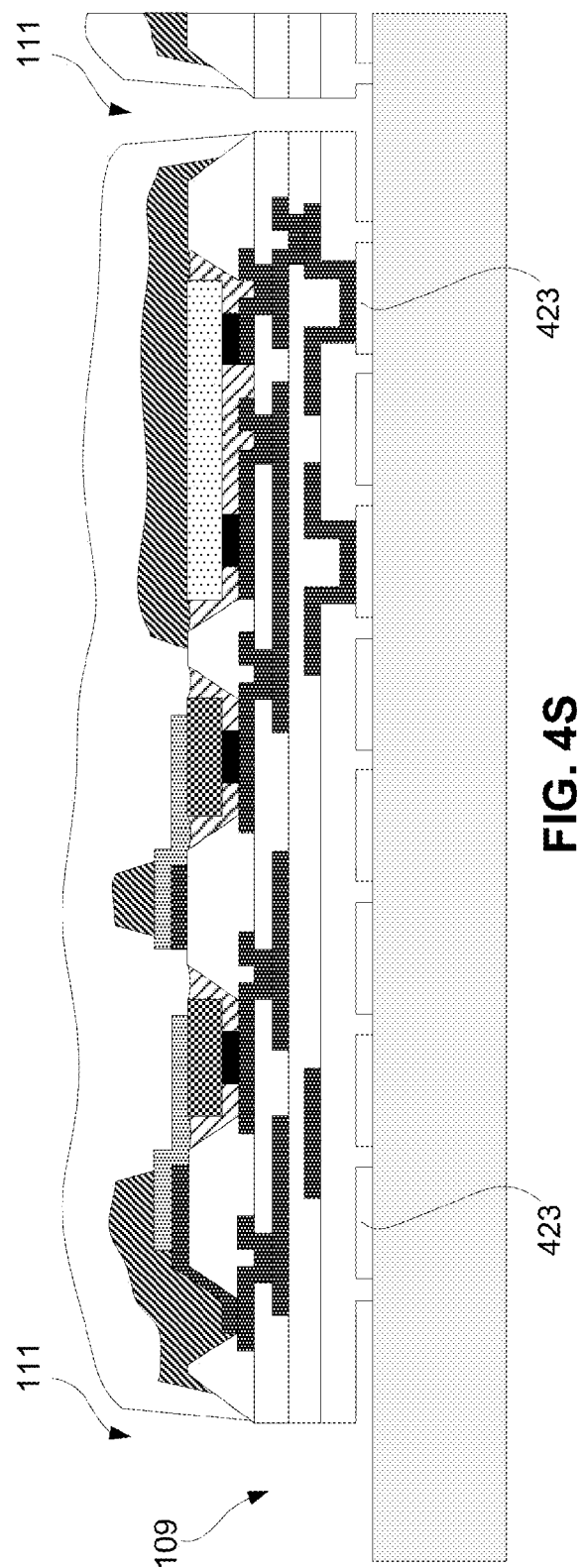

FIGS. 4A-4S illustrate a method of fabricating a flexible display panel 103 including a flexible display substrate 105 with LEDs 106 and microchips 108 on a front surface 223 of the flexible display substrate in accordance with embodiments of the invention. FIGS. 4A-4P illustrate a method of fabricating a flexible display panel 103 with LEDs 106 and microchips 108 on a front surface 223 of the flexible display substrate 105 with covered release openings 111. FIGS. 4Q-4S illustrate a method of fabricating a flexible display panel 103 with LEDs 106 and microchips 108 on a front surface 223 of the flexible display substrate 105 with exposed release openings 111 as continued from FIG. 4N.

With reference to FIG. 4A, a sacrificial layer 201 is formed on a carrier substrate 101. In an embodiment, the carrier substrate 101 is glass. The sacrificial layer 201 may be formed from any material that can be etched selective to the insulating material used to form the flexible display substrate 105 and the carrier substrate 101. In an embodiment, the sacrificial layer is formed from silicon dioxide. Furthermore, in an embodiment, the thickness of the sacrificial layer 201 ranges from 0.5 to 1.5 µm. The sacrificial layer may be formed by a deposition process such as, but not limited to, chemical vapor deposition (CVD) or physical vapor deposition (PVD).

As shown in FIG. 4B, openings 401 are etched into the sacrificial layer 201. The openings 401 may be spaced evenly apart from one another or arranged in a specific pattern. In an embodiment, openings 401 are patterned so that there is an equal distribution of openings dispersed around the area within which the flexible display panel 103 is to be formed. The placement of openings 401 determines the locations of posts 202 as shown in FIG. 4C.

In FIG. 4C, a first layer 203 of the flexible display substrate 105 is formed on the sacrificial layer 201 and within the trench 109. In an embodiment, the first layer 203 is formed from an insulating material. The insulating material may be a polymer or a photo-definable insulating material, such as a photo-definable polymer. In an embodiment, the photo-definable polymer may be an acrylic or an SU-8 photoresist. In a particular embodiment, the first layer 203 is formed from a photo-definable polyimide, so that exposure to electromagnetic radiation chemically modifies the molecular structure of the polyimide to allow solubility in a developer solution. The photo-definable insulating material enables patterning without forming a separate mask layer, such as a photoresist. Therefore, having the photo-definable insulating material may reduce patterning operations and cost. During its formation, the first layer 203 fills in the openings 401 to form a plurality of posts 202. The posts 202 are essentially an extension of the first layer 203 of insulating material such that the posts 202 and the first layer 203 form one integrated structure. The first layer 203 of the flexible display substrate 105 may be formed by spinning on or spray coating a layer of insulating material. When the insulating material is spun on, it fills in the openings 401 and subsequently forms the plurality of posts 202.

As shown in FIG. 4D, via openings 403, release openings 111, and trenches 109 are etched into the first layer 203 of the flexible display substrate 105. In an embodiment, the trenches 109, via openings 403, and release openings 111 extend through the first layer 203 and expose the sacrificial layer 201 underneath. In an embodiment, the via openings 403 are openings used for forming an interconnect via to electrically couple structures above and below the first layer 203. In an embodiment, the release openings 111 and trenches 109 are openings used to provide a passageway for etchant chemicals to remove the sacrificial layer 201. The via openings 403, release openings 111, and trenches 109 may be formed by conventional patterning and developing techniques. In an embodiment, patterned electromagnetic radiation, such as visible or ultraviolet light, is exposed onto the first layer 203. Parts of the first layer 203 that are exposed to the electromagnetic radiation become cross-linked. As such, when the first layer 203 is submerged in a developer solution, unexposed regions are removed to form the patterned openings 403, 111, and 109. Alternatively, if the first layer 203 is not formed from photo-definable material, then another suitable patterning technique may be used to form the openings 403, 111, 109 in the first layer 203.

As shown in FIG. 4E, a first conductive layer 405 is formed over the first layer 203 and within the via openings 403, release openings 111, and trenches 109. The first conductive layer 405 may be formed from a conductive material, such as a metal or a metal alloy, or any combination of multiple layers of conductive materials. In an embodiment, the first conductive layer 405 is a titanium-gold-titanium (Ti—Au—Ti) layer stack where a layer of gold is sandwiched between two thin layers of titanium. One reason why the first conductive layer 405 may be formed with Ti—Au—Ti is because although gold is an excellent conductor and is highly resistant to oxidation, it does not adhere well with insulating materials, such as the first layer 203. As such, adding the outer layers of titanium, which adheres well with insulating material, allows the gold layer to be securely attached to the first layer 203. It is to be appreciated that the thickness of gold may be much greater than the thickness of titanium. In an embodiment, the gold to titanium layer thickness ratio ranges from 5:1 to 10:1. Formation of the first metal layer 405 may be performed by a conformal deposition technique. In one embodiment, the first conductive layer 405, having multiple layers of conductive materials, is formed by sputtering.

As shown in FIG. 4F, openings 407 are etched in the first conductive layer 405 to form back component bond pads 213 having back component bonding surfaces 215 and a first conductive layer 211. The back component bond pads 213 conform to the surfaces of the opening 403 and first layer 203 upon which they are formed. In an embodiment, first conductive layer 211 is a part of an electrical connection between two semiconductor devices within the flexible display substrate 105. The conductive layer formed within the release openings 111 and trenches 109 is removed to expose the sacrificial layer 201 in order for an etchant to reach the sacrificial layer 201 by access through the release openings 111 and trench 109. The openings 407 in the first conductive layer 405 may be etched by a mask and etch process, such as an anisotropic dry or plasma etch process.

FIG. 4G illustrates the flexible display substrate 105 subsequent to iterative formation of second and third insulating layers 205 and 207, respectively, and second and third conductive layers 217 and 218, respectively, with process techniques and conductive materials discussed in FIGS. 4C-4F according to an embodiment of the invention. The third conductive layer 218 includes various device bond pads, such as a ground pad 411, LED pads 413, and microchip pads 415. The second conductive layer 217 is an interconnect layer designed to form various interconnections between back component bond pads 213 and the ground pad 411, LED pads 413, and microchip pads 415. The conductive layers 217 and 218 may be a single conductive layer or multiple conductive layers formed from any conductive material, such as but not limited to, amorphous silicon, conductive oxides, conductive polymers, metals, and metal alloys. For example, in an embodiment, the conductive layers 217 and 218 are formed from aluminum, titanium, or an aluminum and titanium alloy. Additionally, the conductive layers 217 and 218 may be formed from more than one metal layer, such as a titanium-tungsten alloy and gold layer (TiW—Au) or a titanium and aluminum (Ti—Al) layer. In an embodiment, the back component bond pads 213 are electrically coupled to the microchip pads 415 of the flexible display substrate 105 through the second and third conductive layers 217 and 218, respectively. Although the embodiment depicted in FIG. 4G illustrates three insulating layers and three conductive layers, embodiments are not so limited. Various openings 409 in the top conductive layer 218 have been etched to form the ground, LED, and microchip pads 411, 413, and 415, respectively. Throughout the processes up to this point, release openings 111 and trenches 109 have continuously been etched to expose the sacrificial layer 201 such that etchants may access the sacrificial layer 201 through the release openings 111 and trenches 109.

In FIG. 4H, a fourth layer 209 is formed on a portion of the exposed pads 411, 413, and 415 and on exposed top surfaces of the third layer 207 using any of a variety of techniques such as inkjet printing, screen printing, lamination, spin coating, spray coating, CVD, and PVD. The fourth layer 209 may be formed of a variety of insulating materials such as, but not limited to, photo-definable acrylic, photoresist, silicon dioxide, silicon nitride, poly(methyl methacrylate) (PMMA), benzocyclobutene (BCB), polyimide, SU-8 photoresist, acrylate, epoxy, and polyester. In an embodiment, the fourth layer 209 is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g., chromium oxide), or metal nitride particles (e.g., chromium nitride). In an embodiment, the fourth layer 209 is formed from the same material as the first through third layers 203, 205, and 207, respectively, such as a photo-definable insulating material, or any other protective, flexible material.

In an embodiment, the fourth layer 209 has openings 417 that expose the ground pad 411, LED pads 413, and microchip pads 415 to which electrical devices may be electrically coupled. As shown in FIG. 4H, the openings 417 in the fourth layer 209 have oblique sidewalls 221 that slope downward to form a well or a bank structure. In an embodiment, the well may be used for optical separation of adjacent LEDs to prevent optical interference. Additionally, in an embodiment, a surface of the well may be used to form mirrors to aid in light extraction. Furthermore, in an embodiment, the well may provide a structure for pooling sidewall passivation material 227 to passivate sidewalls of the LEDs to prevent shorting of an active layer, and may provide a structure for providing better step coverage for structures (e.g., top contact 229) formed upon it.

As shown in FIG. 4I, conductive ground electrodes 233 are formed on the fourth layer 209 and on the ground pad 411. Conductive ground electrodes 233 provide electrical connections to ground (Vss) for any device to which it is coupled. In an embodiment, the ground electrodes 233 are electrically coupled with at least the second conductive layer 217 through the ground pad 411 to form a connection to ground. The conductive ground electrodes 233 may be formed by a deposition and etch technique. In an embodiment, the conductive ground electrodes 233 are formed by sputtering followed by an anisotropic etch process.

In FIG. 4J, device bonding layers 222 are formed on the exposed LED pads 413 and microchip pads 415 to facilitate bonding of electrical devices. In an embodiment, the device bonding layers 222 are selected for its ability to be interdiffused with a bonding layer on the electrical devices (that are to be placed on the pads) through bonding mechanisms such as eutectic alloy bonding, transient liquid phase bonding, or solid state diffusion bonding. In an embodiment, the device bonding layers 222 have a melting temperature of 250° C. or lower. For example, the device bonding layers 222 may include a solder material such as tin (232° C.) or indium (156.7° C.), or alloys thereof. Device bonding layers 222 may also be in the shape of a post. In accordance with some embodiments of the invention, taller device bonding layers 222 may provide an additional degree of freedom for system component leveling, such as planarity of the electrical devices with the pad during device transfer operations and for variations in height of the devices, due to the change in height of the liquefied bonding layers as they spread out over the pad during bonding. The width of the device bonding layers 222 may be less than a width of a bottom surface of the electrical devices to prevent wicking of the device bonding layers 222 around the sidewalls of the electrical devices which can cause electrical shorting. The device bonding layers 222 may be formed by a photoresist lift-off technique or electroplating.

As shown in FIG. 4K, LEDs 106 and microchips 108 are transferred onto the device interconnect layers 222 such that the LEDs 106 and microchips 108 are electrically coupled to the LED pads 413 and microchip pads 415, respectively. In an embodiment, the LEDs 106 are micro LEDs having a device size of 1-20 µm. The LEDs 106 may be any color-emitting LED, such as a red-, green-, blue-, infrared-, cyan-, white-, yellow-, or any other color-emitting LED. The microchips 108 may contain circuitry to receive signals from display components extraneous to the flexible display substrate 105 as well as circuitry to operate the LEDs 106 according to the received signals. In an embodiment, the microchips 108 contain driving circuitry to drive the LED in forward bias mode for emitting light. Optionally, the microchips 108 may also contain a selection device, such as a multiplexer, to disconnect the LED from the driving circuit and connect to a sensing circuit to operate the LED in reverse bias mode for sensing light. Although FIG. 4K illustrates only two LEDs and one microchip 108, embodiments of the present invention are not limited to such configurations. Rather, any number of LEDs 106 and any number of microchips 108 may transferred onto the flexible display substrate 105. More specifically, the number and size of the LEDs and microchips 108 may scale according to the resolution or size of the flexible display panel 103. Higher numbers and smaller sizes of LEDs and microchips 108 may be formed in flexible display panels that require higher resolutions and/or smaller flexible display panels 103. The LEDs 106 and microchips 108 are electrostatically transferred onto the device bonding layers 222 by a pickup-and-placement method. In one embodiment, an electrostatic transfer head uses electrostatic force to pick up the LEDs 106 and microchips 108 and place them on the device bonding layers 222.

Thereafter, in FIG. 4L, gaps between the LEDs 106 and microchips 108 and the sidewalls 221 of the wells in which they are bonded are filled to form sidewall passivation structures 227. In embodiments, the sidewall passivation structures 227 pool around the LEDs 106 and microchips 108 within the wells in openings 417. The sidewall passivation structures 227 attach to sidewalls of the LEDs 106 and microchips 108 and to the sidewalls 221 of the wells in openings 417. Additionally, the sidewall passivation structures 227 fill gaps underneath the LEDs 106 and microchips 108. In accordance with embodiments of the invention, the sidewall passivation structures 227 are transparent or semi-transparent to the visible wavelength so as to not significantly degrade light extraction efficiency of the LED. Sidewall passivation structures 227 may be formed of a variety of materials such as, but not limited to, epoxy, poly(methyl methacrylate) (PMMA), benzocyclobutene (BCB), polyimide, and polyester. The sidewall passivation structures 227 may be formed by a precision deposition technique such as, but not limited to, inkjet printing.

The sidewall passivation structures 227 may secure the LEDs 106 and microchips 108 in place to prevent electrical disconnection from the device bonding layers 222. Electrical disconnection from the device bonding layers 222 may render the LEDs and microchips 108 inoperable. Additionally, the sidewall passivation structures 227 may provide a surface for better step coverage for structures (e.g., top contact 229) formed on top of the sidewall passivation structures 227. Furthermore, the sidewall passivation structures 227 may insulate exposed sidewalls of the LEDs 106 in order to prevent short circuiting of active layers.

As shown in FIG. 4M, top contacts 229 are formed over the LEDs 106 to electrically couple the LEDs 106 to the metal ground electrodes 233. Depending upon the particular application, top contacts 229 may be opaque, reflective, transparent, or semi-transparent to the visible wavelength spectrum. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the top conductive contact layer 155 includes nanoparticles such as silver, gold, aluminum, molybdenum, titanium, tungsten, ITO, and IZO. In an embodiment, the top contacts 229 are approximately 50 nm to 1 µm thick. Methods of formation include CVD, PVD, spray coating, or spin coating depending upon the desired area to be coated and any thermal constraints. In some embodiments, the top contacts 229 are formed by inkjet printing or screen printing. In an embodiment, inkjet printing or screen printing provides a practical approach for patterning the individual top contacts 229 without requiring separate mask layers.

In FIG. 4N, a black matrix layer 231 having openings 419 is formed over the exposed front surface 223 of the flexible display substrate 105, surrounding the LEDs 106. Exemplary black matrix materials include carbon, metal films (e.g., nickel, aluminum, molybdenum, and alloys thereof), metal oxide films (e.g., chromium oxide), metal nitride films (e.g., chromium nitride), organic resins, glass pastes, and resins or pastes including a black pigment or silver particles. The black matrix layer 231 prevents light from bleeding between LEDs and/or being absorbed by adjacent LEDs. Presence of the black matrix layer 231, therefore, improves the contrast of images displayed on the flexible display panel 103. In an embodiment, portions of the black matrix layer 231 in the release openings 111 and trenches 109 are removed to maintain the release openings 111 and trenches 109. The black matrix layer 231 can be formed from a method that is appropriate based upon the material used. For example, black matrix layer 231 can be applied using inkjet printing, sputter and etching, spin coating with lift-off, lamination, or a printing method.

As shown in FIG. 4O, the sacrificial layer 201 between the flexible display substrate 105 and carrier substrate 101 is removed by etching with an etchant 419 the sacrificial layer 201 selective to the flexible display substrate 105 and carrier substrate 101. The etchant 419 reaches the sacrificial layer 201 through the release openings 111 and the trenches 109. The sacrificial layer 201 is removed by an etchant that can penetrate through the small dimensions between the flexible display substrate 105 and the carrier substrate 101 such as a vapor or plasma etch process. In an embodiment, the sacrificial layer 201 is removed by a vapor etch process utilizing vaporized HF as the etchant. The etchant is selective of the sacrificial layer 201 relative to the flexible display substrate 105 and the carrier substrate 101 such that the sacrificial layer 201 is substantially etched away while the flexible display substrate 105 and the carrier substrate 101 is not substantially etched away. In an embodiment, the flexible display substrate 105 and the carrier substrate 101 remain after removing the sacrificial layer 101. After removing the sacrificial layer 201, the flexible display panel 103 rests upon the carrier substrate 101 by the plurality of posts 202. The plurality of posts 202 are laterally surrounded by voids 423, which were previously occupied by the sacrificial layer 201. In an embodiment, the thin Ti layer of the first metal layer 405 for the back component bonding pads 213 formed of Ti—Au—Ti is simultaneously removed by the selective etch process. Accordingly, the gold layer is exposed to make electrical contact with any display component that electrically couples to it. The gold layer is an excellent conductor and is highly resistive to oxidation.

As shown in FIG. 4P, a protective topcoat 107 is deposited over the display panel 103, including within the release openings 111. The protective topcoat 107 may be formed by lamination, slit coating, inkjet printing, or any deposition and etch techniques. If deposited by a non-precise deposition technique, the protective topcoat 107 formed within the trenches 109 may be removed to maintain the trenches 109 to separate adjacent flexible display panels 103. The protective topcoat 107 may be any suitable transparent, flexible, and protective material to seal the devices and structures that form the display panel 103. Transparency allows light to pass through the protective topcoat 107 to and from the LEDs 106. Furthermore, flexibility allows the flexible display panel 103 to bend and flex in a variety of positions without fracturing the protective topcoat 107. Additionally, the protective property of the protective topcoat 107 seals the devices and structures of the flexible display panel 103 from the environment and protects it from physical intrusion and/or electrical interference. In an embodiment, the protective topcoat 107 is formed from a variety of materials such as, but not limited to, epoxy, acrylic (polyacrylate) such as benzocyclobutene (BCB), polyimide, and polyester. In a specific embodiment, the protective topcoat 107 is formed of poly(methyl methacrylate) (PMMA). Although thick layers of PMMA are rigid and inflexible, the thickness of the protective topcoat 107 is substantially thin to allow flexibility. In an embodiment, the thickness of the protective topcoat ranges from 15 to 20 µm. In an embodiment, the protective topcoat 107 partially fills the release opening 111, or completely fills the release opening 111 such that a bottom surface 421 of the protective topcoat 107 reaches the back surface 225 of the flexible display substrate 105. Once the protective topcoat 107 is formed, the flexible display panel 103 is now ready to be separated from the carrier substrate 101.

FIG. 4Q illustrates an alternative method of fabricating the flexible display panel 103 according to embodiments of the invention. FIG. 4Q continues from FIG. 4N, where the black matrix layer 231 was formed and where the sacrificial layer 201 is still intact. Following formation of the black matrix layer 231, in FIG. 4Q, the protective topcoat 107 may be deposited over the flexible display substrate 103. Portions of the protective topcoat 107 that may be formed directly above or within the release openings 111 and trenches 109 are removed to expose the sacrificial layer 201 such that the sacrificial layer 201 can be accessed by a chemical etchant. Thereafter, in FIG. 4R, the sacrificial release layer 201 may be removed by selectively etching the sacrificial release layer 201 with a selective etchant 419. Selectively removing the sacrificial layer 201 may be performed as discussed above with FIG. 4O. As shown in FIG. 4S, the flexible display panel 103 is now ready to be separated from the carrier substrate 101. The flexible display panel 103 rests upon the carrier substrate 101 with the plurality of posts 202, where each post 202 is laterally surrounded by voids 423 that were previously filled with sacrificial layer 201. Release openings 111 remain exposed within the flexible display panel 103.

FIG. 5 is a schematic cross-sectional side view illustration of a flexible display panel 103 being separated from a carrier substrate 101 in accordance with an embodiment of the invention. In one embodiment, the flexible display panel 103 is separated by lifting a side of the flexible display panel 103 and peeling off the flexible display panel 103 as shown in FIG. 5. The posts 202 may not break or shear when the flexible display panel 103 is separated from the carrier substrate 101, and may remain intact following the separation. Alternatively, in an embodiment, the flexible display panel 103 is vacuumed or electrostatically transferred off of the carrier substrate 101. Harsh, chemical etchants are not needed to remove the flexible display panel 103 because the adhesion force between the plurality of posts 202 and the carrier substrate 101 is low enough to allow physical, dry separation. However, using wet chemical solutions to separate the flexible display panel 103 from the carrier substrate 101 is a viable method of separation that is envisioned in embodiments of the invention.

FIG. 6 is a perspective view of a flexible display panel 103 illustrating an arrangement of LEDs and microchips in accordance with an embodiment of the invention. The flexible display substrate 105 in FIG. 6 is transparent to better illustrate the layout of the flexible display panel 103, and is not intended to be limiting. The array of LEDs 106 and the plurality of microchips 108 are on a front surface 223 of the flexible display panel 103. The conductive layers 211 and 218 are formed to electrically couple the array of LEDs 106 and the plurality of microchips 108 to one another. The conductive layers 211 and 218 may be arranged horizontally and vertically as shown in FIG. 6, although embodiments are not limited to such arrangements for interconnecting the plurality of microchips 108 with the array of LEDs 106. Additionally, the top contact 229 for each LED 106 in the array of LEDs 106 is transparent to allow transmission of light to and from the LEDs 106.

FIG. 7A is a cross-sectional side view illustration of a flexible display panel 103 with back component bond pads 213 on the back surface 225 of the flexible display panel 103 after separation from a carrier substrate 101 in accordance with an embodiment of the invention. The flexible display panel 103 has been separated from the carrier substrate 101 and is ready to be integrated into a flexible display system. The flexible display panel 103 includes a front surface 223 that has an array of LEDs 106 and a plurality of microchips 108. Furthermore, the flexible display panel 103 includes a back surface 225 that includes exposed back component bond pads 213 and a plurality of posts 202. The array of LEDs 106 is electrically coupled to the plurality of microchips 108 such that the plurality of microchips 108 can control the operations of the LEDs 106. In an embodiment, the back component bond pads 213 located on the back surface 225 of the flexible display panel 103 are electrically coupled to the plurality of microchips 108 such that the microchips 108 are capable of receiving operating signals from the back component bond pads 213. Accordingly, the back component bond pads 213 are electrically coupled to the plurality of microchips 108 through the conductive layers 211, 217, and 218 in the flexible display substrate 105. As a result, the back surface 225 is electrically coupled with the front surface 223.

FIG. 7B is a cross-sectional side view illustration of a flexible display system 800 including a flexible display panel 103 and a plurality of display components 803 mounted on a back surface 225 of the flexible display panel 103 in accordance with an embodiment of the invention. The flexible display panel 103 includes covered release openings 111 so that holes do not extend through the flexible display panel 103. The release openings 111 extend from the front surface 223 to the back surface 225 of the flexible display substrate 105. In an alternative embodiment, the release openings 111 are opened to form holes through the flexible display panel 103. A plurality of display components 803 is electrically coupled to the back component bond pads 213. In an embodiment, the display components 803 are electrically coupled to the back component bond pads 213 through solder bumps 805 so that signals can be sent from the display components 803 to the microchips 108. The conductive layers 211, 217, and 218 form the necessary interconnection between the display components 803 and the microchips 108 as well as between the microchips 108 and the LEDs 106. In an embodiment, the back component bonding surfaces 215 of the back component bond pads 213 are formed from gold following the release etch process discussed in FIG. 4O above. In an embodiment, the conductive layers 211, 217, and 218 extend from the front surface 223 to the back surface 225 of the flexible display substrate 105. The display components 803 may be any microchip or microcontroller with circuitry or program instructions used to operate the flexible display panel 103. For example, in an embodiment, the display component 803 is a scan driver chip, a sense controller chip, a data driver chip, a processor chip, or a power supply. In an embodiment, the power supply is a battery.

FIG. 8A is a cross-sectional side view illustration of a flexible display panel 103 with front component bond pads 301 on the front surface 223 of the flexible display panel 103 after separation from a carrier substrate 101 in accordance with an embodiment of the invention. The flexible display panel 103 has been separated from the carrier substrate 101 and is ready to be integrated into a flexible display system. The flexible display substrate 103 includes a front surface 223 that has an array of LEDs 106, a plurality of microchips 108, and a plurality of front component bond pads 301 on the front surface 223. The array of LEDs 106 is electrically coupled to the plurality of microchips 108 such that the plurality of microchips 108 can control the operations of the LEDs 106. The front component bond pads 301 are electrically coupled to the plurality of microchips 108 through at least one of the conductive layers 211, 217, and 218 in the flexible display substrate 105.

FIG. 8B is a cross-sectional side view illustration of a flexible display system 800 including a flexible display panel 103 and a plurality of display components 803 mounted on a front surface 223 of the flexible display panel 103 in accordance with an embodiment of the invention. The flexible display panel 103 includes covered release openings 111 so that holes do not extend through the flexible display panel 103. The release openings 111 extend from the font surface 223 to the back surface 225 of the flexible display substrate 105. In an alternative embodiment, the release openings 111 are opened to form holes through the flexible display panel 103. A plurality of display components 803 is electrically coupled to the front component bond pads 301. Accordingly, in an embodiment, the display components 803 are electrically coupled to the microchips 108 through solder bumps 805 so that signals can be sent from the display components 803 to the microchips 108. The conductive layers 211, 217, and 218 form the necessary interconnection between the display components 803 and the microchips 108 as well as between the microchips 108 and the LEDs 106. The conductive layers 211, 217, and 218 extend at least partially through the flexible display substrate 105. As shown in FIG. 8B, the conductive layers 211, 217, and 218 extend more than half way through the flexible display substrate 105. The conductive layers 211, 217, and 218 do not necessarily extend completely through the flexible display substrate 105 because there are no back component bond pads 513, although embodiments that do extend completely through the flexible display substrate 105 are envisioned in embodiments of the present invention. The display components 803 may be any microchip or microcontroller with circuitry or program instructions used to operate the flexible display panel 103. For example, in an embodiment, the display component 803 is a scan driver chip, a sense controller chip, a data driver chip, a processor chip, or a power supply. In an embodiment, the power supply is a battery.

FIG. 9A is a schematic top view illustration of a back surface 225 of a flexible display system 800 including a flexible display panel 103 and a plurality of display components 803 mounted on a back surface 225 of the flexible display panel 103 in accordance with an embodiment of the invention. The side view illustration of the display system 800 shown in FIG. 9A is illustrated in FIG. 7B discussed above. As shown in FIG. 9A, the array of LEDs 106 and plurality of microchips 108 are illustrated with dotted gray lines to indicate that these devices are located on the front surface 223 of the display panel 103. The area of the flexible display panel 103 where the LEDs 106 and the microchips 108 are located forms a display area 901. The display area 901 is delineated by the dotted gray line formed around the perimeter of the LEDs 106 and microchips 108. The display area 901 is the area where the flexible display system 800 emits and senses light. The plurality of display components 803 may be bonded to the back surface 225 of the flexible display panel 103 in any suitable orientation. As shown in FIG. 9A, the display components 803 are oriented in horizontal and vertical orientations. Furthermore, the display components 803 are electrically coupled with the back component bond pads 213 (not shown, as they are covered by the display components 803). It is to be appreciated that placing the display components 803 on the backside of the display panel 103 allows the construction of a display panel system 800 to have a smaller surface area footprint than the surface area footprint of a display panel system 800 with display components 803 mounted on the font surface 223 of the flexible display panel 103 shown in FIG. 9B. Although FIG. 9A depicts the display components 803 mounted on the back surface 225 of the flexible display panel 103 on the opposite side of the display area 901, the display components may be mounted on the back surface 225 of the flexible display panel 103 outside of the display area 901.

FIG. 9B is a schematic top view illustration of a front side 223 of a flexible display system 800 including a flexible display panel 103 and a plurality of display components 803 mounted on a front surface 223 of the flexible display panel 103 outside of a display area 901 in accordance with an embodiment of the invention. The schematic side view illustration of the display system 800 shown in FIG. 9B is illustrated in FIG. 8B discussed above. A marked difference between mounting the display components 803 on a front surface 223 of the flexible display panel 103 is the increase in surface area footprint of the flexible display system 800. The display components 803 cannot be placed on the front surface 223 of the flexible display panel 103 because doing so would block the LEDs 106 from emitting light. However, placing the display components on the front surface 223 of the flexible display substrate 103 outside of the display area 901 may allow the flexible display system 800 to have a thinner profile. It is to be appreciated that the display components 803 may be arranged in any orientation, not just in the horizontal and vertical orientations as illustrated in FIG. 9B.

In utilizing the various aspects of this invention, it would become apparent to one skilled in the art that combinations or variations of the above embodiments are possible for emitting light with a flexible display panel. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A flexible display panel, comprising:
   a flexible substrate comprising a front surface, a back surface, and a display area on the front surface;
   a plurality of interconnects that extend at least partially through the flexible substrate from the front surface to the back surface, wherein the flexible substrate and the plurality of interconnects form a build-up structure;
   an array of light emitting diodes (LEDs) and a plurality of microchips on the front surface of the flexible substrate in the display area and electrically coupled to the plurality of interconnects, wherein the plurality of microchips are interspersed within the array of LEDs, and each microchip comprises a driving circuit to drive one or more LEDs within the array of LEDs to emit light; and
   a plurality of release openings extending through the flexible substrate from the front surface to the back surface.

2. The flexible display panel of claim 1, further comprising:
   at least one display component electrically coupled to the array of microchips on the front surface of the flexible substrate through the plurality of interconnects, wherein the display component comprises a chip selected from the group consisting of a sense controller chip, a scan driver chip, a data driver chip, a processor chip, and a power supply.

3. The flexible display panel of claim 2, wherein the display component is on the back surface of the flexible substrate.

4. The flexible display panel of claim 2, wherein the display component is on the front surface of the flexible substrate outside of the display area.

5. The flexible display panel of claim 1, wherein the build-up structure comprises at least one layer of polymer and at least one layer of metal.

6. The flexible display panel of claim 1, wherein the array of LEDs is arranged in a matrix including a plurality of rows and a plurality of columns of the LEDs.

7. The flexible display panel of claim 6, wherein the plurality of microchips comprises a row of microchips arranged between two rows of the LEDs.

8. The flexible display panel of claim 6, wherein each driving circuit is to drive a plurality of the LEDs within the array of LEDs.

9. The flexible display panel of claim 8, further comprising at least one display component electrically coupled to the array of microchips on the front surface of the flexible substrate through the plurality of interconnects.

10. The flexible display panel of claim 9, wherein display component comprises a chip selected from the group consisting of a sense controller chip, a scan driver chip, a data driver chip, a processor chip, and a power supply.

11. The flexible display panel of claim 9, wherein the display component is on the back surface of the flexible substrate directly behind the display area.

12. The flexible display panel of claim 8, wherein the plurality of interconnects comprises a plurality of conductive layers coupled to each other.

13. The flexible display panel of claim 1, wherein the array of LEDs is arranged in a matrix including a plurality of rows of the LEDs, and plurality of microchips is arranged in a plurality of rows of the microchips arranged between rows of the LEDs.

14. The flexible display panel of claim 13, wherein each LED has a maximum width of 1 to 20 μm.

15. The flexible display panel of claim 13, wherein further comprising a patterned insulating layer including an array of wells, and the array of LEDs is bonded to a conductive layer in the array of wells.

16. The flexible display panel of claim 15, further comprising a sidewall passivation layer laterally around the array of LEDs within the array of wells.

17. The flexible display panel of claim 13, wherein the plurality of release openings are within the display area.

18. The flexible display panel of claim 17, wherein the plurality of release openings are interspersed within the array of LEDs.

* * * * *